United States Patent
Kim et al.

(10) Patent No.: US 12,538,687 B2
(45) Date of Patent: Jan. 27, 2026

(54) DISPLAY APPARATUS

(71) Applicant: Samsung Display Co., Ltd., Yongin-si (KR)

(72) Inventors: Minsoo Kim, Yongin-si (KR); Yoona Kim, Yongin-si (KR); Anna Ryu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 444 days.

(21) Appl. No.: 18/113,218

(22) Filed: Feb. 23, 2023

(65) Prior Publication Data
US 2023/0269986 A1    Aug. 24, 2023

(30) Foreign Application Priority Data
Feb. 24, 2022  (KR) .................... 10-2022-0024570

(51) Int. Cl.
H10K 59/35    (2023.01)
H10K 59/122   (2023.01)

(52) U.S. Cl.
CPC ......... *H10K 59/353* (2023.02); *H10K 59/122* (2023.02); *H10K 59/352* (2023.02)

(58) Field of Classification Search
CPC ... H10K 59/353; H10K 59/122; H10K 59/352
See application file for complete search history.

(56) References Cited

U.S. PATENT DOCUMENTS

| | | |
|---|---|---|
| 8,598,784 B2 | 12/2013 | Ko |
| 9,595,119 B2 | 3/2017 | Gong |
| 9,892,691 B1 | 2/2018 | Lim et al. |
| 10,187,632 B2 | 1/2019 | Lu et al. |
| 10,629,655 B2 | 4/2020 | Bai et al. |
| 10,665,640 B2 | 5/2020 | Zhu |
| 10,720,481 B2 | 7/2020 | Xiao et al. |
| 10,790,339 B2 | 9/2020 | Yang et al. |
| 10,854,684 B2 | 12/2020 | Huangfu et al. |
| 10,901,314 B2 | 1/2021 | Ji |
| 10,909,901 B2 | 2/2021 | Wu et al. |
| 11,367,756 B2 | 6/2022 | Jo et al. |
| 11,735,108 B2 * | 8/2023 | Liu ................... G09G 3/3233 345/214 |
| 11,903,261 B2 | 2/2024 | Kim et al. |

(Continued)

FOREIGN PATENT DOCUMENTS

| | | |
|---|---|---|
| CN | 104950462 | 9/2015 |
| CN | 109903684 | 6/2019 |

(Continued)

*Primary Examiner* — Tracie Y Green
(74) *Attorney, Agent, or Firm* — Sughrue Mion, PLLC

(57) ABSTRACT

A display apparatus includes a substrate including a unit area having a quadrangular shape, and a first sub-pixel, a second sub-pixel, and a third sub-pixel that are spaced apart from each other in the unit area and respectively emit lights of different colors. The unit area includes a virtual octagon that has a center area overlapping a center area of the unit area and has sides spaced apart from a boundary of the unit area. The first sub-pixel, the second sub-pixel, and the third sub-pixel are disposed inside the virtual octagon. Each of boundaries of at least two of the first sub-pixel, the second sub-pixel, and the third sub-pixel overlaps at least one of the sides of the virtual octagon.

20 Claims, 26 Drawing Sheets

(56) References Cited

U.S. PATENT DOCUMENTS

2017/0352710 A1* 12/2017 Hong .................... H10K 59/352
2020/0119115 A1    4/2020 Moon et al.
2024/0030271 A1*  1/2024 Yu ........................ H10K 59/353

FOREIGN PATENT DOCUMENTS

| CN | 111756877 | 10/2020 |
|----|-----------|---------|
| JP | 2006072176 | 3/2006 |
| JP | 5835770 | 5/2013 |
| KR | 10-1328979 | 1/2013 |
| KR | 10-2015-0030376 A | 3/2015 |
| KR | 10-2150080 | 3/2015 |
| KR | 10-1635079 | 12/2015 |
| KR | 10-2020-0040967 | 4/2020 |
| KR | 10-2021-0042216 | 4/2021 |
| KR | 10-2021-0157932 A | 12/2021 |

* cited by examiner

DISPLAY APPARATUS

CROSS-REFERENCE TO RELATED APPLICATION

This application claims priority to and benefits of Korean Patent Application No. 10-2022-0024570 under 35 U.S.C. § 119, filed on Feb. 24, 2022, in the Korean Intellectual Property Office (KIPO), the entire contents of which are incorporated herein by reference.

BACKGROUND

1. Technical Field

Embodiments relate to a display apparatus.

2. Description of the Related Art

A display apparatus includes pixels. The pixels of the display apparatus for displaying a full-color image emit lights of different colors. For example, some of the pixels in the display apparatus may have a color-converting part. Accordingly, light of a first color generated from a light-emitting part may be converted into light of a second color by the color-converting part, and the converted light of the second color may be emitted to the outside.

SUMMARY

Applicant discovered that there is a high possibility that a defect occurs during a manufacturing process for a display apparatus.

Embodiments provide a display apparatus capable of reducing or minimizing a defect occurrence during a manufacturing process.

Additional aspects will be set forth in part in the description which follows and, in part, will be apparent from the description, or may be learned by practice of the embodiments of the disclosure.

In an embodiment, a display apparatus may include: a substrate including a unit area having a quadrangular shape; and a first sub-pixel, a second sub-pixel, and a third sub-pixel disposed in the unit area, the first sub-pixel, the second sub-pixel, and that third sub-pixel that are spaced apart from each other and respectively emit lights of different colors, wherein the unit area may include a virtual octagon having a center area overlapping a center area of the unit area, the virtual octagon having sides spaced apart from a boundary of the unit area, the first sub-pixel, the second sub-pixel, and the third sub-pixel may be disposed inside the virtual octagon, and each of boundaries of at least two of the first sub-pixel, the second sub-pixel, and the third sub-pixel may overlap at least one of the sides of the virtual octagon.

The sides of the virtual octagon may include a first side, a second side, a third side, a fourth side, a fifth side, a sixth side, a seventh side, and an eighth side that are sequentially disposed in a direction, and a boundary of the first sub-pixel may overlap the first side, the second side, the third side, the seventh side, and the eighth side of the virtual octagon.

A boundary of the second sub-pixel may overlap the fifth side, the sixth side, and the seventh side of the virtual octagon, and a boundary of the third sub-pixel may overlap the third side, the fourth side, and the fifth side.

The sides of the virtual octagon may include a first side, a second side, a third side, a fourth side, a fifth side, a sixth side, a seventh side, and an eighth side that are sequentially disposed in a direction, a boundary of the second sub-pixel may overlap the first side, the fifth side, the sixth side, the seventh side, and the eighth side of the virtual octagon, a boundary of the third sub-pixel may overlap the first side, the second side, the third side, the fourth side, and the fifth side of the virtual octagon, and the first sub-pixel may be disposed between the second sub-pixel and the third sub-pixel.

A boundary of the first sub-pixel may overlap the first side and the fifth side of the virtual octagon.

The sides of the virtual octagon may include a first side, a second side, a third side, a fourth side, a fifth side, a sixth side, a seventh side, and an eighth side that are sequentially disposed in a direction, the unit area may include a first sub-unit area, a second sub-unit area, a third sub-unit area, and a fourth sub-unit area, the first sub-pixel may include a first-first sub-pixel in the first sub-unit area, a first-second sub-pixel in the second sub-unit area, a first-third sub-pixel in the third sub-unit area, and a first-fourth sub-pixel in the fourth sub-unit area, the second sub-pixel may include a second-first sub-pixel in the first sub-unit area, a second-second sub-pixel in the second sub-unit area, a second-third sub-pixel in the third sub-unit area, and a second-fourth sub-pixel in the fourth sub-unit area, the third sub-pixel may include a third-first sub-pixel in the first sub-unit area, a third-second sub-pixel in the second sub-unit area, a third-third sub-pixel in the third sub-unit area, and a third-fourth sub-pixel in the fourth sub-unit area, and the first-first sub-pixel in the first sub-unit area may have a boundary that contacts the seventh side of the virtual octagon, the second-first sub-pixel in the first sub-unit area may be disposed to be adjacent to the center area of the virtual octagon, the third-first sub-pixel in the first sub-unit area may have a boundary that contacts the first side of the virtual octagon, the first-second sub-pixel, the second-second sub-pixel, and the third-second sub-pixel disposed in the second sub-unit area may be symmetrical to the first-first sub-pixel, the second-first sub-pixel, and the third-first sub-pixel in the first sub-unit area with respect to a first central line extending in a first direction and passing through the center area of the virtual octagon, the first-third sub-pixel, the second-third sub-pixel, and the third-third sub-pixel disposed in the third sub-unit area may be point-symmetrical to the first-first sub-pixel, the second-first sub-pixel, and the third-first sub-pixel in the first sub-unit area with respect to the center area of the virtual octagon, and the first-fourth sub-pixel, the second-fourth sub-pixel, and the third-fourth sub-pixel disposed in the fourth sub-unit area may be symmetrical to the first-first sub-pixel, the second-first sub-pixel, and the third-first sub-pixel in the first sub-unit area with respect to a second central line extending in a second direction perpendicular to the first direction, and passing through the center area of the virtual octagon.

The sides of the virtual octagon may include a first side, a second side, a third side, a fourth side, a fifth side, a sixth side, a seventh side, and an eighth side that are sequentially disposed in a direction, the first sub-pixel may include a plurality of first sub-pixels, the second sub-pixel may include a plurality of second sub-pixels, the third sub-pixel may include a plurality of third sub-pixels, and the first side, the third side, the fifth side, and the seventh side of the virtual octagon may overlap a boundary of at least one of the plurality of first sub-pixels, a boundary of at least one of the plurality of second sub-pixels, and a boundary of at least one of the plurality of third sub-pixels.

The plurality of first sub-pixels may be apart from each other in a diagonal direction of the unit area.

The unit area may have a first virtual vertical line, a second virtual vertical line, a third virtual vertical line, a first virtual horizontal line, a second virtual horizontal line, and a third virtual horizontal line, the first virtual vertical line, the second virtual vertical line, and the third virtual vertical line may pass through the virtual octagon in a first direction and may be spaced apart from each other, and the first virtual horizontal line, the second virtual horizontal line, and the third virtual horizontal line may pass through the virtual octagon in a second direction and may be spaced apart from each other, the first virtual vertical line and the first virtual horizontal line may pass only the first sub-pixel, the second virtual vertical line and the second virtual horizontal line may pass only the second sub-pixel, and the third virtual vertical line and the third virtual horizontal line may pass only the third sub-pixel.

The display apparatus may further include: a bank layer disposed in the unit area, the bank layer including: a first hole overlapping the first sub-pixel, a second hole overlapping the second sub-pixel, a third hole overlapping the third sub-pixel, and auxiliary holes; a first quantum-dot layer disposed in the first hole; and a second quantum-dot layer disposed in the second hole, wherein some of the auxiliary holes may be disposed along the first, second, and third virtual vertical lines or the first, second, and third virtual horizontal lines.

The some of the auxiliary holes may be disposed in a region between adjacent two sub-pixels among the first, second, and third sub-pixels.

The some of the auxiliary holes may be disposed along a boundary of the unit area.

The sides of the virtual octagon may include a first side, a second side, a third side, a fourth side, a fifth side, a sixth side, a seventh side, and an eighth side that are sequentially disposed in a direction, the third sub-pixel may have a rectangular shape having a long axis that may overlap a first diagonal line connecting vertexes of the unit area, a center area of the first sub-pixel may overlap a second diagonal line connecting vertexes of the unit area, and a center area of the second sub-pixel may overlap the second diagonal line.

A boundary of the third sub-pixel may overlap the second side and the sixth side of the virtual octagon.

A boundary of the first sub-pixel may overlap the fourth side of the virtual octagon.

A boundary of the second sub-pixel may overlap the eighth side of the virtual octagon.

The display apparatus may further include: a pixel-defining layer disposed over the substrate, the pixel-defining layer including: a first opening that exposes a central portion of a pixel electrode of the first sub-pixel, a second opening that exposes a central portion of a pixel electrode of the second sub-pixel, a third opening that exposes a central portion of a pixel electrode of the third sub-pixel, and fourth openings each having a center area at each vertex of the unit area, wherein a boundary of the first sub-pixel may overlap the first opening, a boundary of the second sub-pixel may overlap the second opening, and a boundary of the third sub-pixel may overlap the third opening.

The display apparatus may further include: a plurality of auxiliary electrodes disposed over the substrate; an intermediate layer including: an emission layer disposed on a pixel electrode of the first sub-pixel, a pixel electrode of the second sub-pixel, and a pixel electrode of the third sub-pixel, and contact holes that respectively overlap the fourth openings; and an opposite electrode disposed on the intermediate layer, wherein the fourth openings and the contact holes may expose a portion of each of the auxiliary electrodes, and the opposite electrode may be electrically connected to the auxiliary electrodes through the fourth openings and the contact holes.

The display apparatus may further include: a plurality of auxiliary wirings disposed over the substrate; an intermediate layer including: an emission layer disposed on a pixel electrode of the first sub-pixel, a pixel electrode of the second sub-pixel, and a pixel electrode of the third sub-pixel, and contact holes that respectively overlap the fourth openings; and an opposite electrode disposed on the intermediate layer, wherein the fourth openings and the contact holes may expose a portion of each of the auxiliary wirings, and the opposite electrode may be electrically connected to the auxiliary wirings through the fourth openings and the contact holes.

An area of the first sub-pixel may be greater than an area of the second sub-pixel and an area of the third sub-pixel, and the area of the second sub-pixel may be equal to or greater than the area of the third sub-pixel.

In an embodiment, a display apparatus may include: a substrate including a unit area having a quadrangular shape; and a first sub-pixel, a second sub-pixel, and a third sub-pixel that are spaced apart from each other in the unit area and respectively emit lights of different colors, wherein the first sub-pixel and the second sub-pixel may be adjacent to each other in a first direction, and the second sub-pixel and the third sub-pixel may be adjacent to each other in a second direction perpendicularly intersecting the first direction.

The display apparatus may further include: a pixel-defining layer disposed over the substrate, the pixel-defining layer including: a first opening that exposes a central portion of a pixel electrode of the first sub-pixel, a second opening that exposes a central portion of a pixel electrode of the second sub-pixel, a third opening that exposes a central portion of a pixel electrode of the third sub-pixel, and a fourth opening overlapping two adjacent sides of the unit area, wherein the first opening and the fourth opening may be adjacent to each other in the second direction.

In an embodiment, a display apparatus may include: a substrate; and first sub-pixels, second sub-pixels, and third sub-pixels that are spaced apart from each other over the substrate and emit lights of different colors, wherein the first sub-pixels, the second sub-pixels, and the third sub-pixels may be disposed in a matrix having rows and columns, each row of the matrix may include at least one of the first sub-pixels, at least one of the second sub-pixels, and at least one of the third sub-pixels, the at least one of the first sub-pixels and the at least one of the third sub-pixels spaced apart from each other by a first distance that is equal to or greater than a column distance between adjacent rows, and each column of the matrix may include at least one of the first sub-pixels, at least one of the second sub-pixels, and at least one of the third sub-pixels, the at least one of the second sub-pixels and the at least one of the third sub-pixels spaced apart from each other by a second distance that is equal to or greater than a row distance between adjacent rows.

A distance between the first sub-pixels disposed in each row may be equal to a distance between the first sub-pixels disposed in each column.

These and/or other aspects will become apparent and more readily appreciated from the following detailed description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
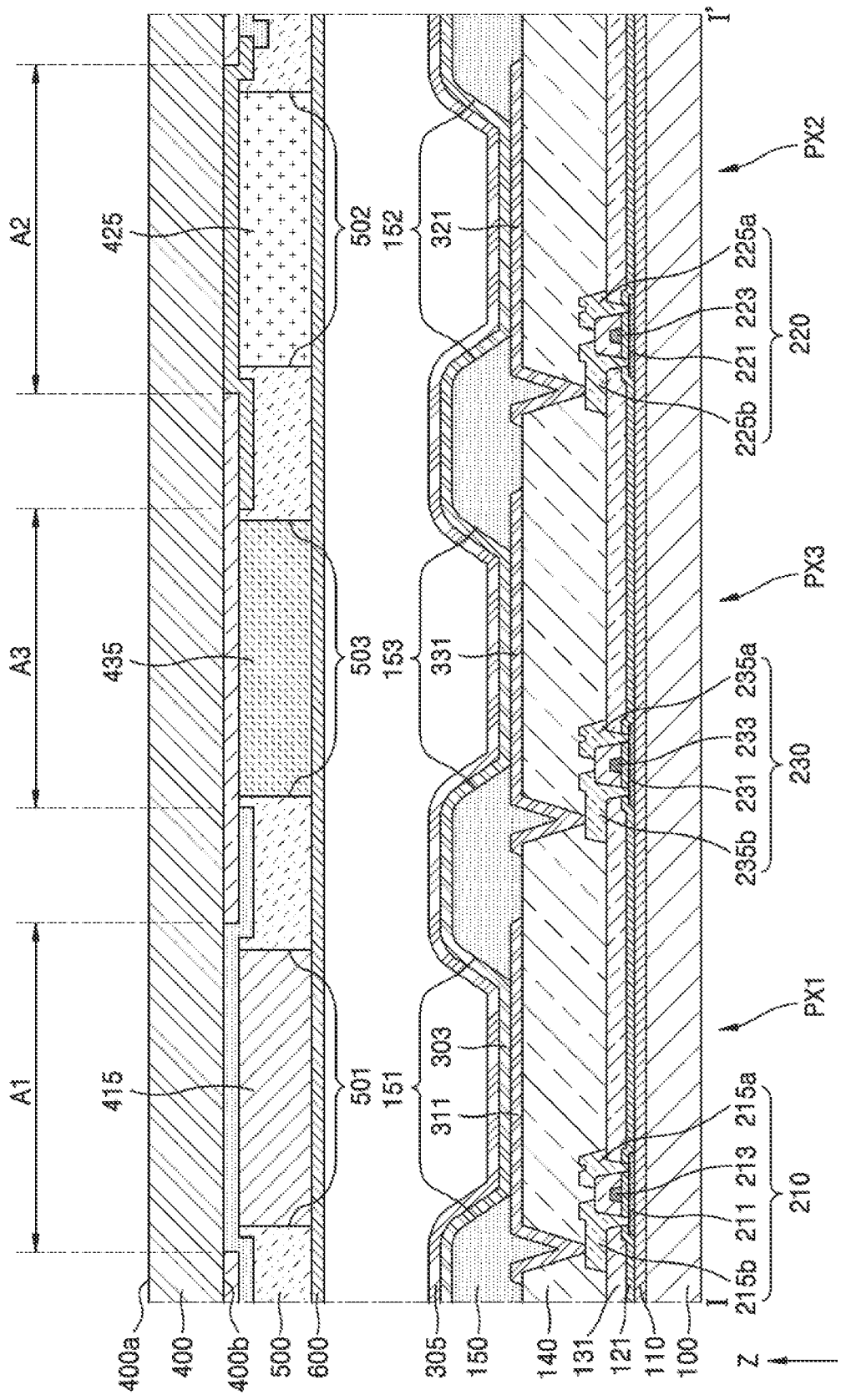
FIG. 1 is a schematic cross-sectional view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, embodiments are not limited to the following embodiments and may be embodied in various forms.

Hereinafter, embodiments will be described with reference to the accompanying drawings, wherein like reference numerals refer to like elements throughout and a redundant description thereof is omitted for descriptive convenience.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. For example, intervening layers, regions, or components may be present.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the specification, "A and/or B" means A or B, or A and B. In the specification, "at least one of A and B" means A or B, or A and B.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the case where a certain embodiment may be implemented differently, a specific process order may be performed in the order different from the described order. As an example, two processes successively described may be simultaneously performed substantially and performed in the opposite order.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

Figure 3:
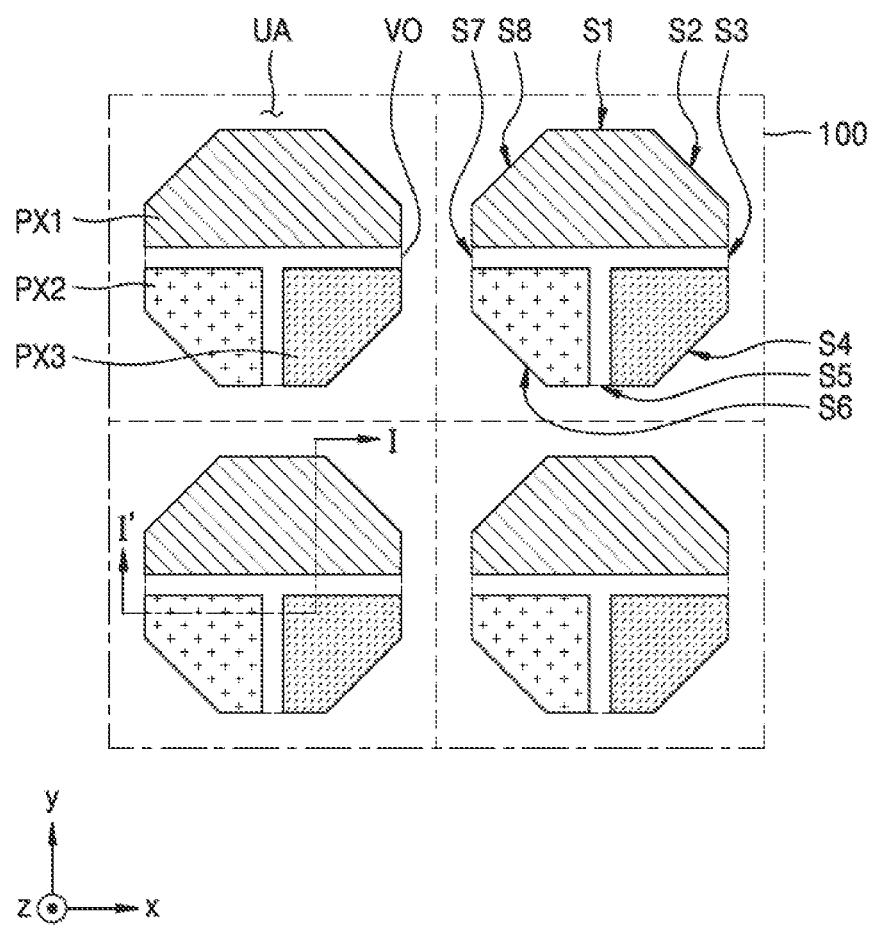
FIG. 3 is a schematic plan view of a portion of the display apparatus of FIG. 1 according to an embodiment.

FIG. 1 is a schematic cross-sectional view of a display apparatus taken along line I-I' of FIG. 3 according to an embodiment.

The display apparatus according to the embodiment may include a first substrate 100, a first sub-pixel PX1, a second sub-pixel PX2, and a third sub-pixel PX3 each arranged on the first substrate 100, and a second substrate 400.

The first substrate 100 may include glass, metal, or a polymer resin. The first substrate 100 may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The first substrate 100 may have a multi-layer structure including two layers each including the polymer resin, and a barrier layer including an inorganic material (e.g., silicon oxide, silicon nitride, and silicon oxynitride) between the two layers. However, embodiments are not limited thereto.

A first pixel electrode 311, a second pixel electrode 321, and a third pixel electrode 331 may be disposed over the first substrate 100. Besides the first pixel electrode 311, the second pixel electrode 321, and the third pixel electrode 331, a first thin-film transistor 210, a second thin-film transistor 220, and a third thin-film transistor 230 respectively connected to the first pixel electrode 311, the second pixel electrode 321, and the third pixel electrode 331 may be disposed over the first substrate 100. As shown in FIG. 1, the first pixel electrode 311 may be electrically connected to the first thin-film transistor 210, the second pixel electrode 321 may be electrically connected to the second thin-film transistor 220, and the third pixel electrode 331 may be electrically connected to the third thin-film transistor 230. The first pixel electrode 311, the second pixel electrode 321, and the third pixel electrode 331 may be disposed on a planarization layer 140 described below that is disposed over the first substrate 100.

The first thin-film transistor 210 may include a first semiconductor layer 211, a first gate electrode 213, a first source electrode 215a, and a first drain electrode 215b. For example, the first semiconductor layer 211 may include amorphous silicon, polycrystalline silicon, an organic semiconductor material, or an oxide semiconductor material. The first gate electrode 213 may include various conductive materials and have various layer structures, and include, for example, a molybdenum (Mo) layer and an aluminum (Al) layer. For example, the first gate electrode 213 may have a stacked structure of Mo/Al/Mo. In another example, the first gate electrode 213 may include a titanium nitride ($TiN_x$) layer, an Al layer, and/or a Ti layer. The first source electrode 215a and the first drain electrode 215b may also include various conductive materials and various layer structures, and may include, for example, a Ti layer, an Al layer, and/or a copper (Cu) layer. For example, the first source electrode 215a and the first drain electrode 215b may each have a stacked structure of Ti/Al/Ti.

To secure insulation between the first semiconductor layer 211 and the first gate electrode 213, a gate insulating layer 121 may be disposed between the first semiconductor layer 211 and the first gate electrode 213. For example, the gate insulating layer 121 may include an inorganic material such as silicon oxide, silicon nitride, and/or silicon oxynitride. For example, an interlayer insulating layer 131 may be disposed on the first gate electrode 213. For example, the interlayer insulating layer 131 may include an inorganic material such as silicon oxide, silicon nitride, and/or silicon oxynitride. The first source electrode 215a and the first drain electrode 215b may be disposed on the interlayer insulating layer 131. The insulating layer including the inorganic material may be formed by chemical vapor deposition (CVD) or atomic layer deposition (ALD). This is also applicable to embodiments below and modifications thereof.

A buffer layer 110 may be disposed between the first thin-film transistor 210 and the first substrate 100. For example, the buffer layer 110 may include an inorganic material such as silicon oxide, silicon nitride, and/or silicon oxynitride. The buffer layer 110 may increase flatness of the upper surface of the first substrate 100, or prevent or reduce impurities from being permeated into the first semiconductor layer 211 of the first thin-film transistor 210 through the first substrate 100.

The second thin-film transistor 220 disposed in the second sub-pixel PX2 may include a second semiconductor layer 221, a second gate electrode 223, a second source electrode 225a, and a second drain electrode 225b. The third thin-film transistor 230 disposed in the third sub-pixel PX3 may include a third semiconductor layer 231, a third gate electrode 233, a third source electrode 235a, and a third drain electrode 235b. Since the structure of the second thin-film transistor 220 and the structure of the third thin-film transistor 230 are the same as or similar to the structure of the first thin-film transistor 210 disposed in the first sub-pixel PX1, descriptions thereof are omitted for descriptive convenience.

The planarization layer 140 may be disposed on the first thin-film transistor 210. As an example, as shown in FIG. 1, in the case where an organic light-emitting element including the first pixel electrode 311 is disposed over the first thin-film transistor 210, the planarization layer 140 may substantially planarize an upper portion of a protective layer covering the first thin-film transistor 210. The planarization layer 140 may include, for example, acryl, benzocyclobutene (BCB), or hexamethyldisiloxane (HMDSO). Although FIG. 1 illustrates that the planarization layer 140 is a single layer, the planarization layer 140 may be a multi-layer. However, embodiments are not limited thereto.

An organic light-emitting element may be disposed in the first sub-pixel PX1. For example, the organic light-emitting element may include the first pixel electrode 311, an opposite electrode 305, and an intermediate layer 303 disposed between the first pixel electrode 311 and the opposite electrode 305. For example, the intermediate layer 303 may include an emission layer. As shown in FIG. 1, the first pixel electrode 311 may be electrically connected to the first thin-film transistor 210 by contacting one of the first source electrode 215a and the first drain electrode 215b through a contact hole formed in the planarization layer 140 and the like. The first pixel electrode 311 may include a light-transmissive conductive layer and a reflective layer. For example, the light-transmissive conductive layer may include a light-transmissive conductive oxide such as indium tin oxide (ITO), indium oxide ($In_2O_3$), or indium zinc oxide (IZO). The reflective layer may include metal such as aluminum (Al) or silver (Ag). As an example, the first pixel electrode 311 may have a three-layer structure of ITO/Ag/ITO.

An organic light-emitting element may be disposed in the second sub-pixel PX2. For example, the organic light-emitting element may include the second pixel electrode 321, the opposite electrode 305, and the intermediate layer 303 disposed between the second pixel electrode 321 and the opposite electrode 305. For example, the intermediate layer 303 may include the emission layer. An organic light-emitting element may be disposed in the third sub-pixel PX3, and may include the third pixel electrode 331, the opposite electrode 305, and the intermediate layer 303 disposed between the third pixel electrode 331 and the opposite electrode 305. For example, the intermediate layer 303 may include the emission layer. The second pixel electrode 321 may be electrically connected to the second thin-film transistor 220 by contacting one of the second source electrode 225a and the second drain electrode 225b through a contact hole formed in the planarization layer 140 and the like. The third pixel electrode 331 may be electrically connected to the third thin-film transistor 230 by contacting one of the third source electrode 235a and the third drain electrode 235b through a contact hole formed in the planarization layer 140 and the like. The description of the first pixel electrode 311 is applicable to the second pixel electrode 321 and the third pixel electrode 331.

Figure 5A:
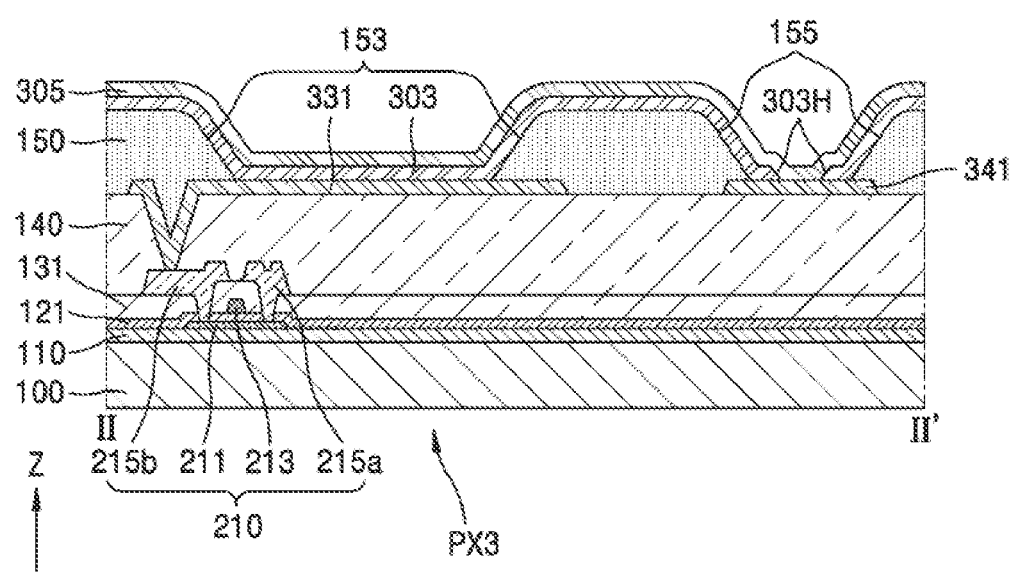
FIGS. 5A, 5B, and 5C are schematic cross-sectional views of the display apparatus, taken along line II-II' of FIG. 4.

As described above, the intermediate layer 303 including the emission layer may be disposed on the second pixel electrode 321 of the second sub-pixel PX2 and the third pixel electrode 331 of the third sub-pixel PX3 as well as the first pixel electrode 311 of the first sub-pixel PX1. The intermediate layer 303 may continuously extend (as one body) over the first pixel electrode 311, the second pixel electrode 321, and the third pixel electrode 331. For example, as shown in FIG. 5A, the intermediate layer 303 may have a contact hole 303H for electrical contact between the opposite electrode 305 and an auxiliary electrode 341. For example, the intermediate layer 303 may be patterned on the first pixel electrode 311, the second pixel electrode 321, and the third pixel electrode 331. The intermediate layer 303 may include a hole injection layer, a hole transport layer, and/or an electronic transport layer, and the like in addition to the emission layer. Some of the layers included in the intermediate layer 303 may continuously extend (as one body) over the first pixel electrode 311, the second pixel electrode 321, the third pixel electrode 331, and other layers may be patterned to be separately disposed on the first pixel electrode 311, the second pixel electrode 321, and the third pixel electrode 331.

The emission layer of the intermediate layer 303 may emit light having a wavelength in a first wavelength band. The first wavelength band may be, for example, in a range from about 450 nm to about 495 nm.

The opposite electrode 305 on the intermediate layer 303 may continuously extend (as one body) over the first pixel electrode 311 to third pixel electrode 331. The opposite electrode 305 may include a light-transmissive conductive layer including ITO, $In_2O_3$, or IZO, and include a semi-transmissive layer including metal such as aluminum (Al), lithium (Li), magnesium (Mg), ytterbium (Yb), or silver (Ag). As an example, the opposite electrode 305 may be a semi-transmissive layer including MgAg, AgYb, Yb/MgAg, or Li/MgAg.

A pixel-defining layer 150 may be disposed on the planarization layer 140. The pixel-defining layer 150 may include openings each corresponding to (e.g., overlapping) each pixel. For example, the pixel-defining layer 150 may cover the edges of each of the first pixel electrode 311, the second pixel electrode 321, and the third pixel electrode 331, and may include a first opening 151 that exposes the central portion of the first pixel electrode 311, a second opening 152 that exposes the central portion of the second pixel electrode 321, and a third opening 153 that exposes the central portion of the third pixel electrode 331. The pixel-defining layer 150 may define sub-pixels. For example, as shown in FIG. 1, the pixel-defining layer 150 may prevent arcs and the like from occurring at the edges of the first pixel electrode 311, the second pixel electrode 321, and the third pixel electrode 331 by increasing a distance between the opposite electrode 305 and the edges of each of the first pixel electrode 311, the second pixel electrode 321, and the third pixel electrode 331. The pixel-defining layer 150 may include an organic material such as polyimide or HMDSO.

As shown in FIG. 5A, the pixel-defining layer 150 may further include fourth openings 155 for electrical contact between the opposite electrode 305 and the auxiliary electrode 134. In a plan view, the contact hole 303H of the intermediate layer 303 may overlap the fourth opening 155 of the pixel-defining layer 150. The opposite electrode 305 may receive additional power through the auxiliary electrode 134 and thus prevent reduction of brightness of pixels disposed in a middle area (e.g., a center area) of a large-sized display apparatus.

The second substrate 400 may include a first area A1 overlapping the first opening 151, a second area A2 overlapping the second opening 152, and a third area A3 overlapping the third opening 153. The second substrate 400 may be disposed over the first substrate 100 such that the first pixel electrode 311, the second pixel electrode 321, and the third pixel electrode 331 are disposed between the second substrate 400 and the first substrate 100. The second substrate 400 may include glass, metal, or a polymer resin. The second substrate 400 may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The second substrate 400 may have a multi-layer structure including two layers each including the polymer resin, and a barrier layer including an inorganic material (such as silicon oxide, silicon nitride, and silicon oxynitride) between the two layers. However, embodiments are not limited thereto. The second substrate 400 may be flexible or bendable.

A bank layer 500 may be disposed on a lower surface 400b of the second substrate 400 that faces the first substrate 100 in a direction (e.g., a z-axis direction). For example, the bank layer 500 may be disposed between the second substrate 400 and the first substrate 100. The bank layer 500 may include first holes 501, second holes 502, third holes 503, and auxiliary holes 510.

The first hole 501 of the bank layer 500 may correspond to (e.g., overlap) the first opening 151 of the pixel-defining layer 150, the second hole 502 of the bank layer 500 may correspond to (e.g., overlap) the second opening 152 of the pixel-defining layer 150, and the third hole 503 of the bank layer 500 may correspond to (e.g., overlap) the third opening 153 of the pixel-defining layer 150. When viewed in a direction (e.g., the z-axis direction) perpendicular to an upper surface 400a of the second substrate 400, the first hole 501 of the bank layer 500 may overlap the first opening 151 of the pixel-defining layer 150 that exposes the first pixel electrode 311, the second hole 502 of the bank layer 500 may overlap the second opening 152 of the pixel-defining layer 150 that exposes the second pixel electrode 321, and the third hole 503 of the bank layer 500 may overlap the third opening 153 of the pixel-defining layer 150 that exposes the third pixel electrode 331. Accordingly, when viewed in the direction (e.g., the z-axis direction) perpendicular to the upper surface 400a of the second substrate 400, the shape of the edges of each of the first to third holes 501, 502, and 503 of the bank layer 500 may be the same as or similar to the shape of the edges of the first to third openings 151, 152, and 153 of the pixel-defining layer 150 corresponding thereto. Accordingly, the first hole 501 of the bank layer 500 may correspond to (e.g., overlap) the first pixel electrode 311, the second hole 502 of the bank layer 500 may correspond to (e.g., overlap) the second pixel electrode 321, and the third hole 503 of the bank layer 500 may correspond to (e.g., overlap) the third pixel electrode 331.

The bank layer 500 may include various materials, and include an inorganic material such as silicon oxide, silicon nitride, and/or silicon oxynitride. For example, the bank layer 500 may include a photoresist material. Thus, the bank layer 500 may be readily formed by processes such as exposure and developing processes.

A first quantum-dot layer 415 may be disposed inside the first holes 501 of the bank layer 500. When viewed in the direction (e.g., the z-axis direction) perpendicular to the upper surface 400a of the second substrate 400, the first quantum-dot layer 415 may overlap the first pixel electrode 311. The first quantum-dot layer 415 may convert light in the first wavelength band (e.g., a range from about 450 nm to about 495 nm) that passes through the first quantum-dot layer 415 into light in a second wavelength band. The second wavelength band may be, for example, in a range from about 630 nm to about 780 nm. However, embodiments are not limited thereto. For example, the first wavelength band before the wavelength conversion by the first quantum-dot layer 415 and the second wavelength band after the wavelength conversion by the first quantum-dot layer 415 may be varied or modified.

The first quantum-dot layer 415 may include quantum dots dispersed therein. In embodiments, quantum dots denote crystals of a semiconductor compound, and may include an arbitrary material that may emit light in various wavelength bands according to the size of the crystals. A diameter of the quantum dots may be, for example, about 1 nm to about 10 nm.

Quantum dots may be synthesized or formed by a wet chemical process, a metal organic chemical vapor deposition process, a molecular beam epitaxy process, or a similar process. A wet chemical process may be a method of mixing an organic solvent with a precursor material and then growing quantum dot crystals. In a wet chemical process, in case that the crystal grows, the organic solvent may naturally act as a dispersant coordinated on the surface of the quantum dot crystal and may control the growth of the crystal. Accordingly, the wet chemical process may be simpler than vapor deposition such as metal organic chemical vapor deposition (MOCVD) or molecular beam epitaxy (MBE). For example, the wet chemical process may control the growth of the quantum dots at low costs.

The quantum dot may include one of a Group III-VI semiconductor compound, a Group II-VI semiconductor compound, a Group III-V semiconductor compound, a Group I-III-VI semiconductor compound, a Group IV-VI semiconductor compound, a Group IV element or compound, or an arbitrary combination thereof.

Examples of a group III-VI semiconductor compound may include a two-element compound including one of GaS, GaSe, $Ga_2Se_3$, GaTe, InS, InSe, $In_2Se_3$, and InTe; a three-element compound including one of $InGaS_3$ and $InGaSe_3$; and an arbitrary combination thereof. Examples of a group II-VI semiconductor compound may include a two-element compound including one of CdS, CdSe, CdTe, ZnS, ZnSe, ZnTe, ZnO, HgS, HgSe, HgTe, MgSe, and MgS; a three-element compound including one of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS; a three-element compound including one of CdZnSeS, CdZnSeTe, CdZnSTe, CdHgSeS, CdHgSeTe, CdHgSTe, HgZnSeS, HgZnSeTe, and HgZnSTe; and an arbitrary combination thereof.

Examples of a group III-V semiconductor compound may include a two-element compound including one of GaN, GaP, GaAs, GaSb, AlN, AlP, AlAs, AlSb, InN, InP, InAs, and InSb; a three-element compound including one of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and GaAlNP; and a four-element compound including one of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb, and an arbitrary combination thereof. The III-V semiconductor compound may further include a Group II element. Examples of a Group III-V semiconductor compound further including a Group II element may include InZnP, InGaZnP, or InAlZnP.

Examples of a Group I-III-VI semiconductor compound may include a three-element compound including AgInS, $AgInS_2$, CuInS, $CuInS_2$, $CuGaO_2$, $AgGaO_2$, or $AgAlO_2$, and an arbitrary combination thereof.

Examples of a Group IV-VI semiconductor compound may include a two-element compound including SnS, SnSe, SnTe, PbS, PbSe, or PbTe, a three-element compound including SnSeS, SnSeTe, SnSTe, PbSeS, PbSeTe, PbSTe, SnPbS, SnPbSe, or SnPbTe, a four-element compound including SnPbSSe, SnPbSeTe, or SnPbSTe, or an arbitrary combination thereof.

A Group IV element or compound may include a single-element compound including Si or Ge, or a two-element compound including SiC or SiGe, or an arbitrary combination thereof.

Each element included in a multi-element compound such as a two-element compound, a three-element compound, and a four-element compound may be present in a particle in a uniform concentration or a non-uniform concentration.

A quantum dot may have a single structure having a uniform concentration of each element included in the quantum dot, or a double structure having a core and a shell covering the core. As an example, a material of the core may be different from a material of the shell. The shell of the quantum dot may function as a protective layer that prevents a chemical change of the core to maintain a semiconductor characteristic and/or may function as a charging layer for providing an electrophoretic characteristic to the quantum dot. The shell may include a single layer or a multi-layer. An interface (or boundary) between the core and the shell may have a concentration gradient in which the concentration of an element existing in the shell gradually reduces as being closer to the center of the core.

Examples of the shell of the quantum dot may include oxide of metal or non-metal, a semiconductor compound, or a combination thereof. Examples of oxides of metals or non-metals may include a two-element compound including $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and a three-element compound including $MgAl_2O_4$, $CoFe_2O_4$, $NiFe_2O_4$, $CoMn_2O_4$, and an arbitrary combination thereof. Examples of the semiconductor compound may include, as described above, a Group III-VI semiconductor compound, a Group II-VI semiconductor compound, a Group III-V semiconductor compound, a Group I-III-VI semiconductor compound, and a Group IV-VI semiconductor compound, or an arbitrary combination thereof. As an example, the semiconductor compound may include one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and an arbitrary combination thereof.

A quantum dot may have a full width of half maximum (FWHM) of a light emission wavelength spectrum of about 45 nm or less, specifically about 40 nm or less, and more specifically about 30 nm or less. Within this range, color purity or color reproduction may be improved. For example, since light emitted from the quantum dot is emitted in all directions, a viewing angle of light may be improved or widened.

For example, the shape of the quantum dot may be a spherical shape, a pyramid shape, a multi-arm shape, a cubic shape, a nanoparticle, a nanotube, a nanowire, a nanofiber, a nano plate particle, or the like.

Since an energy band gap is adjusted by adjusting the size of the quantum dot, the lights in various wavelength bands may be generated from a quantum-dot emission layer. Accordingly, a light-emitting element that emits light in various wavelengths may be implemented by using quantum dots of different sizes. For example, the size of the quantum dot may be selected such that red light, green light, and/or blue light is emitted. For example, the size of the quantum dot may be configured such that the lights in various colors are combined to emit white light.

The first quantum-dot layer 415 may include scatterers. Since incident light is scattered by scatterers of the first quantum-dot layer 415, the incident light may be efficiently converted by the quantum dots inside the first quantum-dot layer 415. The scatterers are not limited as long as they are materials that may partially scatter transmitted light by forming an optical interface between the scatterers and the light-transmissive resin. For example, the scatterers may be metal oxide particles or organic particles. Examples of metal oxides for scatterers may include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and organic materials for scatterers. Examples of an organic material for the scatters may include an acrylic resin or a urethane resin. The scatterers may scatter light in various directions regardless of an incident angle while substantially not converting the wavelength of incident light. Thus, the scatterers may improve the lateral visibility of the display apparatus. For example, the scatterers of the first quantum-dot layer 415 may increase a light-converting efficiency by increasing a probability that light incident to the first quantum-dot layer 415 meets the quantum dots.

For a resin used for the first quantum-dot layer 415, any material may be used as long as the material has a high dispersion characteristic for the scatterers and a light-transmissive characteristic. As an example, a polymer resin such as an acryl-based resin, an imide-based resin, an epoxy-based resin, BCB, or HMDSO may be used for forming the first quantum-dot layer 415. The material for forming the first quantum-dot layer 415 may be disposed inside the first hole 501 of the bank layer 500 overlapping the first pixel electrode 311 by an inkjet printing process.

A second quantum-dot layer 425 may be disposed inside the second holes 502 of the bank layer 500. When viewed in the direction (e.g., the z-axis direction) perpendicular to the upper surface 400a of the second substrate 400, the second quantum-dot layer 425 may overlap the second pixel electrode 321. The second quantum-dot layer 425 may convert light in the first wavelength band that passes through the second quantum-dot layer 425 into light in a third wavelength band. The third wavelength band may be, for example, in a range from about 495 nm to about 570 nm. However, embodiments are not limited thereto. For example, the first wavelength band before the wavelength conversion by the second quantum-dot layer 425 and the second wavelength band after the wavelength conversion by the second quantum-dot layer 425 may be varied or modified.

The second quantum-dot layer 425 may have quantum dots dispersed therein. In embodiments, quantum dots may be crystals of a semiconductor compound, and may include an arbitrary material that may emit light in various wavelength bands according to the size of the crystals. A diameter of the quantum dots may be, for example, about 1 nm to about 10 nm. Since the description of the quantum dots included in the first quantum-dot layer 415 is applicable to quantum dots included in the second quantum-dot layer 425, description of the quantum dots included in the second quantum-dot layer 425 is omitted for descriptive convenience.

The second quantum-dot layer 425 may include scatterers. Since incident light is scattered by scatterers of the second quantum-dot layer 425, the incident light may be efficiently converted by the quantum dots inside the second quantum-dot layer 425. The scatterers are not limited as long as they are materials that may partially scatter transmitted light by forming an optical interface between the scatterers and the light-transmissive resin. For example, the scatterers may be metal oxide particles or organic particles. A metal oxide for the scatterers or an organic material for the scatterers are the same as described above. The scatterers may scatter light in various directions regardless of an incident angle while substantially not converting the wavelength of incident light. Thus, the scatterers may improve the lateral visibility of the display apparatus. For example, the scatterers of the second quantum-dot layer 425 may increase a light-converting efficiency by increasing a probability that light incident to the second quantum-dot layer 425 meets the quantum dots.

For a resin used for the second quantum-dot layer 425, any material may be used as long as the material has a high dispersion characteristic for the scatterers and a light-transmissive characteristic. As an example, a polymer resin such as an acryl-based resin, an imide-based resin, an epoxy-based resin, BCB, or HMDSO may be used for forming the second quantum-dot layer 425. The material for forming the second quantum-dot layer 425 may be disposed inside the second hole 502 of the bank layer 500 overlapping the second pixel electrode 321 by an inkjet printing process.

The third sub-pixel PX3 may emit light of a wavelength in the first wavelength band that is generated from the intermediate layer 303 including the emission layer, to the outside through the second substrate 400 without wavelength conversion. Accordingly, the third sub-pixel PX3 may not have a quantum-dot layer. Accordingly, a light-transmissive layer 435 including a light-transmissive resin may be disposed inside the third hole 503 of the bank layer 500 overlapping the third pixel electrode 331. The light-transmissive layer 435 may include acryl, benzocyclobutene (BCB), or hexamethyldisiloxane (HMDSO). Besides, the light-transmissive layer 435 may also include scatterers. Compared to the embodiment of FIG. 1, the light-transmissive layer 435 inside the third hole 503 of the bank layer 500 may not be disposed.

Figure 4:
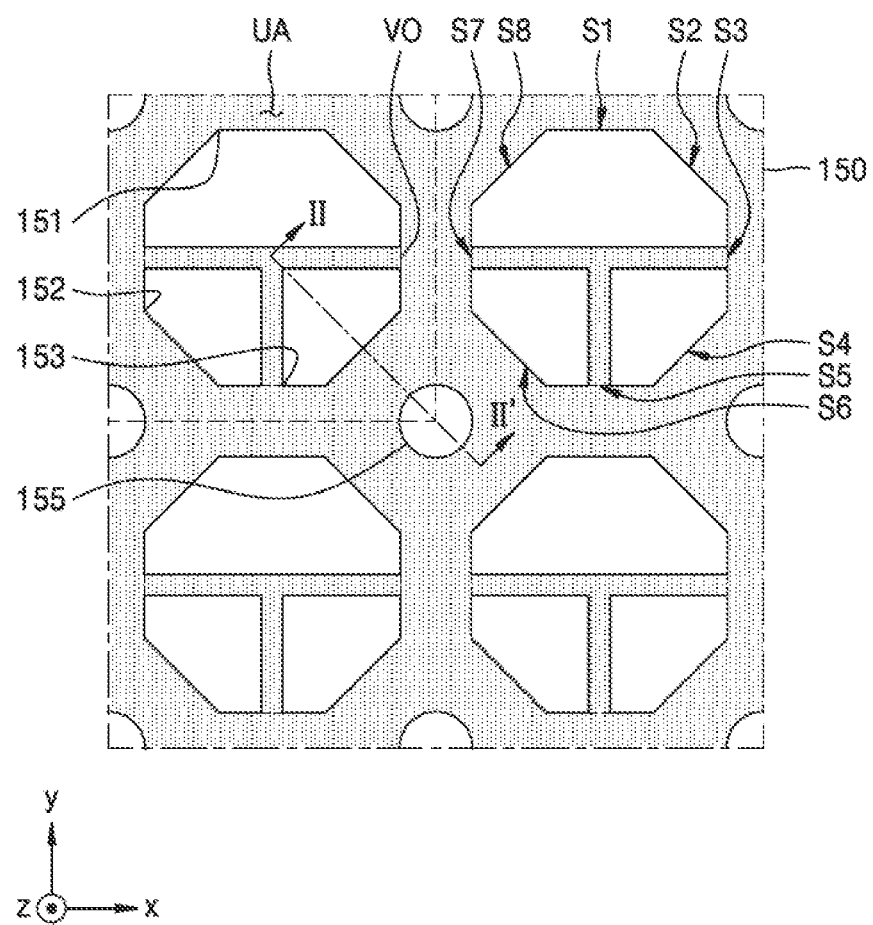
FIG. 4 is a schematic plan view of a pixel-defining layer of the display apparatus of FIG. 1.

To protect the first quantum-dot layer 415, the second quantum-dot layer 425, and the light-transmissive layer 435, a protective layer 600 may be disposed as shown in FIGS. 1 and 4. For example, the protective layer 600 may contact surfaces (e.g., lower surfaces) of the first quantum-dot layer 415, the second quantum-dot layer 425, and the light-transmissive layer 435 that face the first substrate 100. The protective layer 600 may include an inorganic material such as silicon oxide or silicon nitride. As an example, the protective layer 600 may have a two-layer structure including a silicon oxide layer and a silicon nitride layer.

As described above, the first quantum-dot layer 415 and the second quantum-dot layer 425 may be formed by an inkjet printing process. For example, the bank layer 500 including the first hole 501, the second hole 502, and the third hole 503 may be formed on the second substrate 400. The first quantum-dot layer 415 and the second quantum-dot layer 425 may be formed by dotting a material for forming the first quantum-dot layer 415 in the first hole 501 using an inkjet printing process, and dotting a material for forming the second quantum-dot layer 425 in the second hole 502 using an inkjet printing process.

Figure 13:
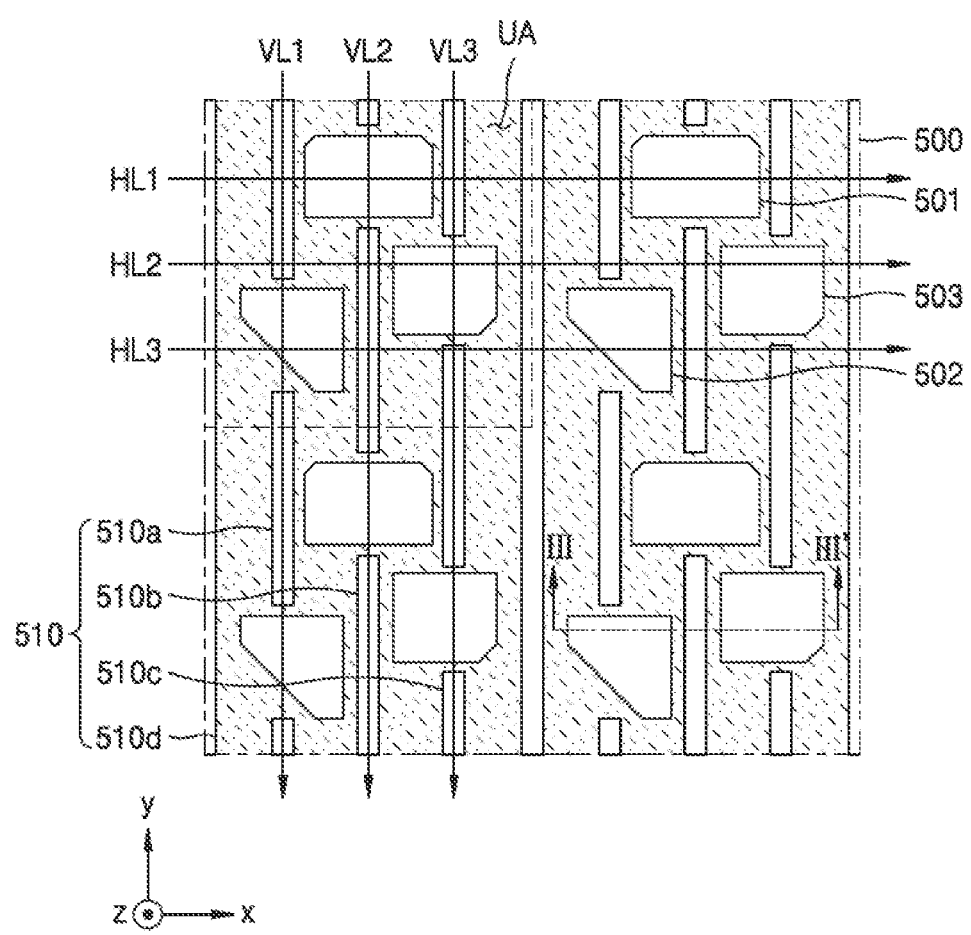
FIG. 13 is a schematic plan view of a bank layer of the display apparatus of FIG. 12.
Figure 16:
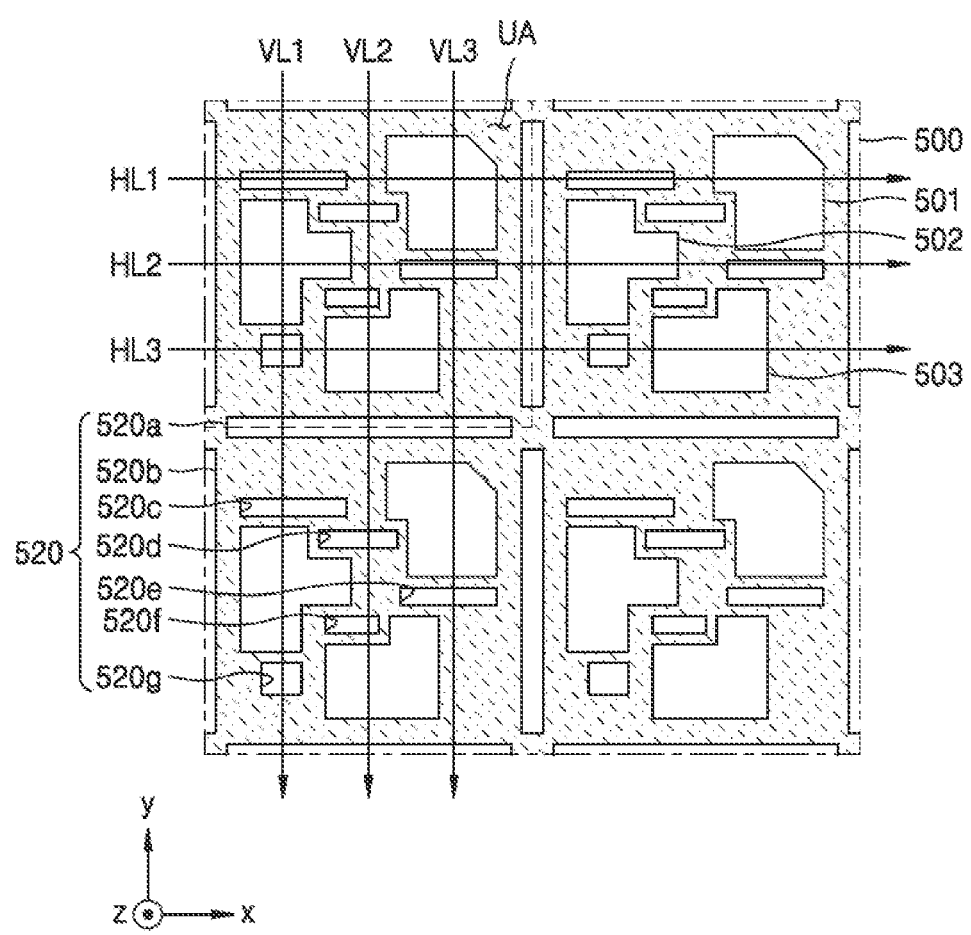
FIG. 16 is a schematic plan view of the bank layer of the display apparatus of FIG. 15.
Figure 20:
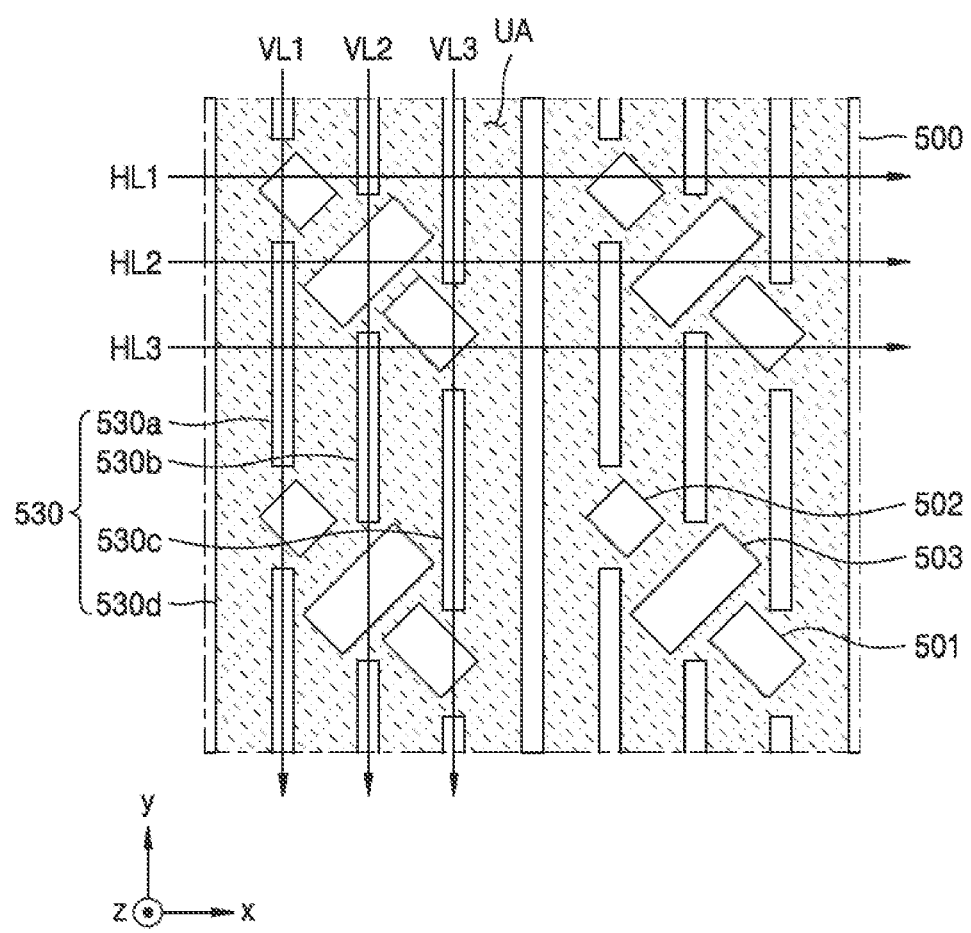
FIG. 20 is a schematic plan view of the bank layer of the display apparatus of FIG. 19.

For example, during a process of dotting the material for forming the first quantum-dot layer 415 using an inkjet printing process, the material may not be disposed in the first hole 501, and during a process of dotting the material for forming the second quantum-dot layer 425, the material may not be disposed in the second hole 502. For example, the bank layer 500 may include the auxiliary holes 510 in the display apparatus according to embodiments as shown in FIGS. 13, 16, and 20 in order to reduce a probability that the material for forming the first quantum-dot layer 415 is disposed in the second hole 502 or the third hole 503, and to reduce a probability that the material for forming the second quantum-dot layer 425 is disposed in the first hole 501 or the third hole 503.

Figure 2:
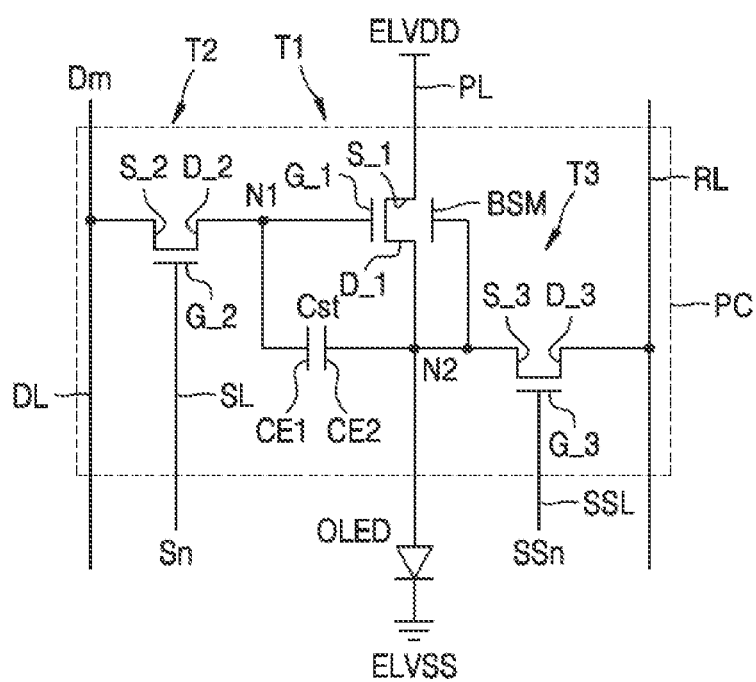
FIG. 2 is an equivalent circuit diagram of a pixel of the display apparatus according to an embodiment.

FIG. 2 is an equivalent circuit diagram of a pixel of the display apparatus according to an embodiment.

Referring to FIG. 2, each pixel may be implemented by a pixel circuit PC and an organic light-emitting diode OLED connected to the pixel circuit PC. For example, the pixel circuit PC may be connected to a scan line SL and a data line DL. The pixel circuit PC may include a driving thin-film transistor T1, a switching thin-film transistor T2, a sensing thin-film transistor T3, and a storage capacitor Cst.

The scan line SL may be connected to a gate electrode G_2 of the switching thin-film transistor T2. The data line DL may be connected to a source electrode S_2 of the switching thin-film transistor T2. A first electrode CE1 of the storage capacitor Cst may be connected to a drain electrode D_2 of the switching thin-film transistor T2.

Accordingly, the switching thin-film transistor T2 may supply a data voltage of the data line DL to a first node N1 in response to a scan signal Sn from the scan line SL of each pixel.

A gate electrode G_1 of the driving thin-film transistor T1 may be connected to the first node N1. A source electrode S_1 of the driving thin-film transistor T1 may be connected to a driving voltage line PL that transfers a driving voltage ELVDD. A drain electrode D_1 of the driving thin-film transistor T1 may be connected to a pixel electrode of the organic light-emitting diode OLED.

Accordingly, the driving thin-film transistor T1 may adjust the amount of a current flowing through the organic light-emitting diode OLED according to a source-gate voltage Vgs of the driving thin-film transistor T1, e.g., a voltage applied between the driving voltage ELVDD and the first node N1.

A sensing control line SSL may be connected to a gate electrode G_3 of the sensing thin-film transistor T3, a source electrode S_3 may be connected to a second node N2, and a drain electrode D_3 may be connected to a reference voltage line RL. In an embodiment, the sensing thin-film transistor T3 may be controlled by the scan line SL instead of the sensing control line SSL.

The sensing thin-film transistor T3 may sense an electric potential of a first electrode (e.g., a pixel electrode) of the organic light-emitting diode OLED. The sensing thin-film transistor T3 may supply a pre-charging voltage from the reference voltage line RL to the second node N2 in response to a sensing signal SSn from the sensing control line SSL, or supply a voltage of the first electrode (e.g., the pixel electrode) of the organic light-emitting diode OLED to the reference voltage line RL during a sensing period.

The first electrode CE1 of the storage capacitor Cst may be connected to the first node N1, and a second electrode CE2 may be connected to the second node N2. The storage capacitor Cst may be charged with a difference voltage between voltages respectively supplied to the first node N1 and the second node N2, and may supply the difference voltage as a driving voltage of the driving thin-film transistor T1. As an example, the storage capacitor Cst may be charged with a difference voltage between a data voltage Dm and a pre-charging voltage Vpre respectively supplied to the first node N1 and the second node N2.

A bias electrode BSM may be formed to correspond to the driving thin-film transistor T1 and may be connected to the source electrode S_3 of the sensing thin-film transistor T3. Since the bias electrode BSM receives a voltage in cooperation with the potential of the source electrode S_3 of the sensing thin-film transistor T3, the operation of the driving thin-film transistor T1 may be stabilized. In an embodiment, the bias electrode BSM may not be connected to the source electrode S_3 of the sensing thin-film transistor T3, but may be connected to a separate bias line.

A second electrode (e.g., a cathode) of the organic light-emitting diode OLED may receive a common voltage ELVSS. The organic light-emitting diode OLED may emit light by receiving a driving current from the driving thin-film transistor T1.

Thought it is shown in FIG. 2 that the signals lines, e.g., the scan line SL, the sensing control line SSL, and the data line DL, the reference voltage line RL, and the driving voltage line PL, are provided for each pixel, embodiments are not limited thereto. As an example, at least one of the signals lines, e.g., the scan line SL, the sensing control line SSL, and the data line DL, and/or the reference voltage line RL, and the driving voltage line PL, may be shared by adjacent pixels (or may be commonly connected to the adjacent pixels).

For example, the pixel circuit PC is not limited to the number of thin-film transistors, the number of storage capacitors, and the circuit design described with reference to FIG. 2, and the number of thin-film transistors, the number of storage capacitors, and the circuit design may be variously changed.

FIG. 3 is a schematic plan view of a portion of the display apparatus of FIG. 1 according to an embodiment.

FIG. 3 is a view for explaining a configuration of the first sub-pixel PX1, the second sub-pixel PX2, and the third sub-pixel PX3 when viewed in a direction perpendicular to the upper surface 400a of the second substrate 400.

Referring to FIG. 3, the first substrate 100 may have a unit area UA having a quadrangular shape. Although FIG. 3 illustrates that the unit area UA has a square shape, the unit area UA may have a rectangular shape or a rhombus shape.

A virtual octagon VO may be disposed inside the unit area UA. The virtual octagon VO may have a center area (or a center point) overlapping a center area (or a center point) of the unit area UA. The virtual octagon VO may have sides spaced apart inward from the boundary of the unit area UA. In an embodiment, a first side S1 of the virtual octagon VO may be parallel to a boundary on one side of the unit area UA. For example, the sides of the virtual octagon VO are respectively defined as first, second, third, fourth, fifth, sixth, seventh, and eighth sides S1, S2, S3, S4, S5, S6, S7, and S8 that are sequentially disposed in a clockwise direction. For example, the first side S1, the third side S3, the fifth side S5, and the seventh side S7 may be respectively parallel to the boundaries of the unit area UA. For example, the virtual octagon VO may be a polygon made up of eighth sides, e.g., a regular octagon or irregular octagon. However, embodiments are not limited thereto.

The first sub-pixel PX1, the second sub-pixel PX2, and the third sub-pixel PX3 may be arranged in the unit area UA and disposed inside the virtual octagon VO.

The boundary of the first sub-pixel PX1 may contact (or extend along) the first side S1 of the virtual octagon VO, the second side S2 and the third side S3 of the virtual octagon VO that are sequentially disposed from the first side S1 in a clockwise direction, and the seventh side S7 and the eighth side S8 of the virtual octagon VO that are sequentially disposed from the first side S1 in a counterclockwise direction. For example, the boundary of the first sub-pixel PX1 may contact (or overlap) the five sides (e.g., S1, S2, S3, S7, and S8) of the virtual octagon VO.

The second sub-pixel PX2 may contact (or overlap) a portion of the fifth side S5 of the virtual octagon VO parallel to the first side S1, the sixth side S6 and the seventh side S7 of the virtual octagon VO sequentially disposed from the fifth side S5 in a clockwise direction. For example, the second sub-pixel PX2 may contact (or overlap) the three sides (e.g., S5, S6, and S7) of the virtual octagon VO. The third sub-pixel PX3 may contact (or overlap) a portion of the fifth side S5 of the virtual octagon VO parallel to the first side S1, the fourth side S4 and the third side S3 of the virtual octagon VO sequentially disposed from the fifth side S5 in a counterclockwise direction. As an example, the third sub-pixel PX3 may contact (or overlap) the three sides (e.g., S3, S4, and S5) of the virtual octagon VO.

In an embodiment, the first sub-pixel PX1 may emit light in the second wavelength band, the second sub-pixel PX2 may emit light in the third wavelength band, and the third sub-pixel PX3 may emit light in the first wavelength band. As an example, the first wavelength band may be in the range of about 450 nm to about 495 nm, the second wavelength band may be in the range of about 630 nm to about 780 nm, and the third wavelength band may be in the range of about 495 nm to about 570 nm. For example, the area of the first sub-pixel PX1 may be equal to or greater than the area of the second sub-pixel PX2 and the area of the third sub-pixel PX3. The area of the second sub-pixel PX2 may be equal to or greater than the area of the third sub-pixel PX3. For example, color scheme of the display apparatus may be optimized by adjusting an area ratio of the first sub-pixel PX1, the second sub-pixel PX2, and the third sub-pixel PX3 inside the virtual octagon VO.

Figure 5B:
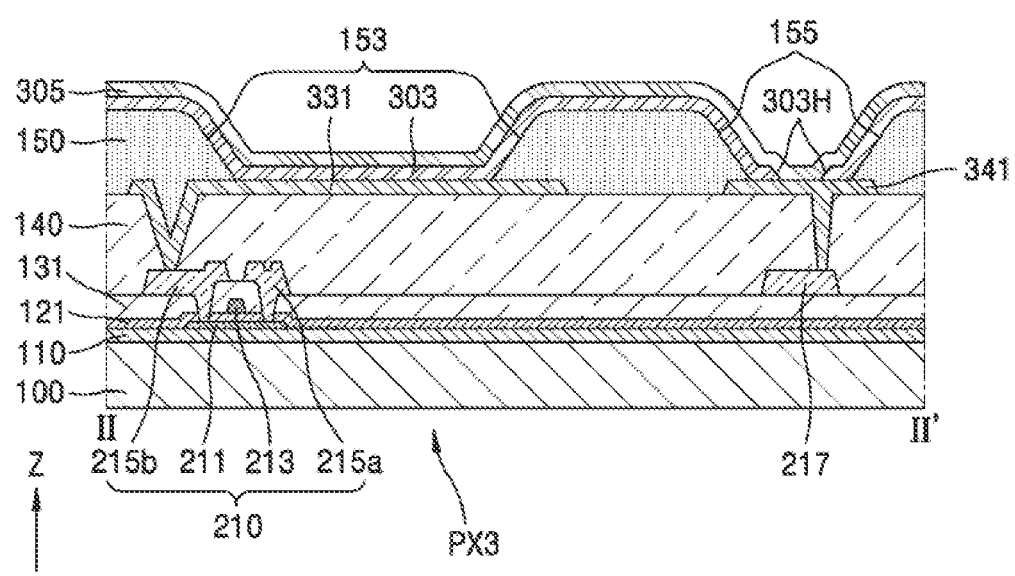
Figure 5C:
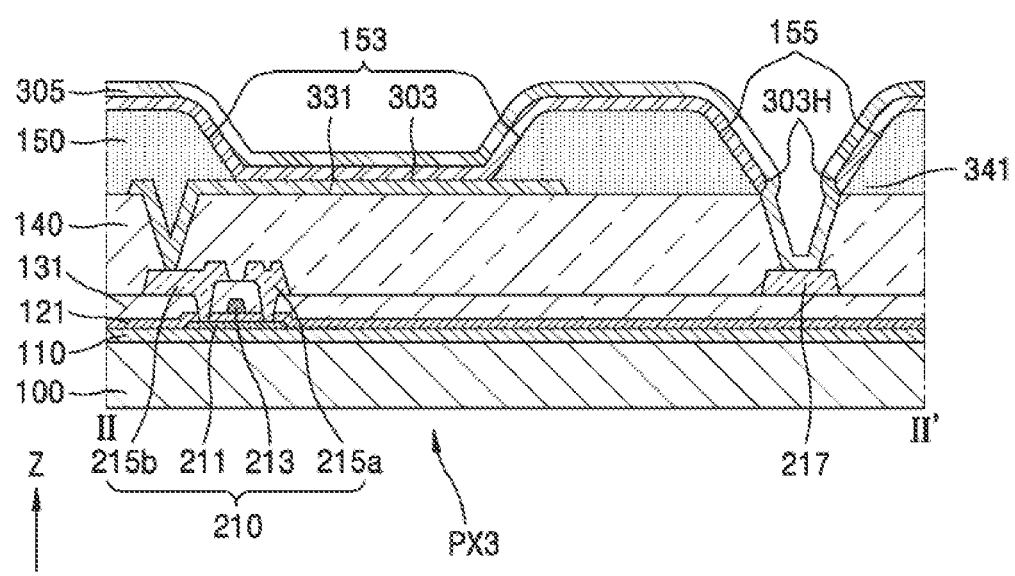

FIG. 4 is a schematic plan view of a pixel-defining layer of the display apparatus of FIG. 1, and FIGS. 5A to 5C are schematic cross-sectional views of the display apparatus, taken along line II-II' of FIG. 4. In FIGS. 5A to 5C, for convenience of illustration, the second substrate 400, the first quantum-dot layer 415, the second quantum-dot layer 425, the light-transmissive layer 435, the bank layer 500, and the protective layer 600 are omitted.

Referring to FIG. 4, as described above, the pixel-defining layer 150 may further include the first opening 151, the second opening 152, and the third opening 153 respectively defining the sub-pixels, and fourth openings 155 for electrical contact between the opposite electrode 305 (see FIG. 1) and the auxiliary electrode 134 (see FIG. 1).

In an embodiment, the boundary of the first sub-pixel PX1 (see FIG. 3) may be the same as or similar to the boundary of the first opening 151, the boundary of the second sub-pixel PX2 (see FIG. 3) may be the same as or similar to the boundary of the second opening 152, and the boundary of the third sub-pixel PX3 (see FIG. 3) may be the same as or similar to the boundary of the third opening 153.

As described above, the sides of the virtual octagon VO may be respectively defined as the first, second, third, fourth, fifth, sixth, seventh, and eighth sides S1, S2, S3, S4, S5, S6, S7, and S8 that are sequentially disposed in a clockwise direction. For example, the boundary of the first opening 151 may contact (or overlap) the first side S1 of the virtual octagon VO, the second side S2 and the third side S3 of the virtual octagon VO that are adjacent to the first side S1 on one side, and the seventh side S7 and the eighth side S8 of the virtual octagon VO that are adjacent to the first side S1 on another side. For example, the boundary of the first opening 151 may contact the five sides (e.g., S1, S2, S3, S7, and S8) of the virtual octagon VO. However, embodiments are not limited thereto.

The fourth opening 155 may overlap the respective vertexes of the unit area UA. As an example, the center area (or the center point) of the fourth opening 155 may overlap the respective vertexes of the unit area UA. The fourth opening 155 may expose a portion of the auxiliary electrode 341 disposed under the pixel-defining layer 150.

Referring to FIGS. 5A and 5B, the auxiliary electrode 341 may be disposed between the planarization layer 140 and the pixel-defining layer 150. In an embodiment, the auxiliary electrode 341, the first pixel electrode 311, the second pixel electrode 321, and the third pixel electrode 331 may be disposed on the same layer. In an embodiment, the auxiliary electrode 341 may include a light-transmissive conductive layer and a reflective layer. For example, the light-transmissive conductive layer may include a light-transmissive conductive oxide such as indium tin oxide (ITO), indium oxide ($In_2O_3$), or indium zinc oxide (IZO). The reflective layer may include metal such as aluminum (Al) or silver (Ag). As an example, the auxiliary electrode 341 may have a three-layer structure of ITO/Ag/ITO.

As described above, the intermediate layer 303 may continuously extend (as a shape that is one body) over the first pixel electrode 311 (see FIG. 1), the second pixel electrode 321 (see FIG. 3), and the third pixel electrode 331. For example, the intermediate layer 303 may continuously extend (as a shape that is one body) over adjacent unit areas UA. The intermediate layer 303 may include a contact hole 303H overlapping the fourth opening 155. In an embodiment, the contact hole 303H may overlap each vertex of the unit area UA. The contact hole 303H may expose a portion of the auxiliary electrode 341.

The opposite electrode 305 may be electrically connected to the auxiliary electrode 341 through the contact hole 303H of the intermediate layer 303 and the fourth opening 155. The auxiliary electrode 341 may supply additional power to the opposite electrode 305, and thus prevent reduction in the brightness of pixels disposed in a middle area (e.g., a center area) of a large-sized display apparatus.

As shown in FIG. 5B, the auxiliary electrode 341 may be electrically connected to an auxiliary wiring 217 disposed between the interlayer insulating layer 131 and the planarization layer 140. As an example, the auxiliary wiring 217 and the first source electrode 215a and the first drain electrode 215b of the first thin-film transistor 210 may be disposed on the same layer. The auxiliary wiring 217 may supply additional power to the auxiliary electrode 341.

In another example, as shown in FIG. 5C, the auxiliary electrode 341 may be omitted. As an example, the planarization layer 140 may include an opening or a hole overlapping the fourth opening 155. The opposite electrode 305 may contact (e.g., directly contact) the auxiliary wiring 217 through the opening or hole of the planarization layer 140.

Each of the four sides of the virtual octagon VO facing the respective vertexes of the unit area UA may be defined by being apart from the center area (or the center point) of the fourth opening 155 by a distance (e.g., a preset distance). Accordingly, since the boundary of the virtual octagon VO is formed to contact the boundary of the first opening 151 to the third opening 153, a space for preventing adjacent sub-pixels from being damaged due to a laser drill process for forming the contact hole 303H may be secured or provided, and an aperture ratio of the pixel may be reduced.

Figure 6:
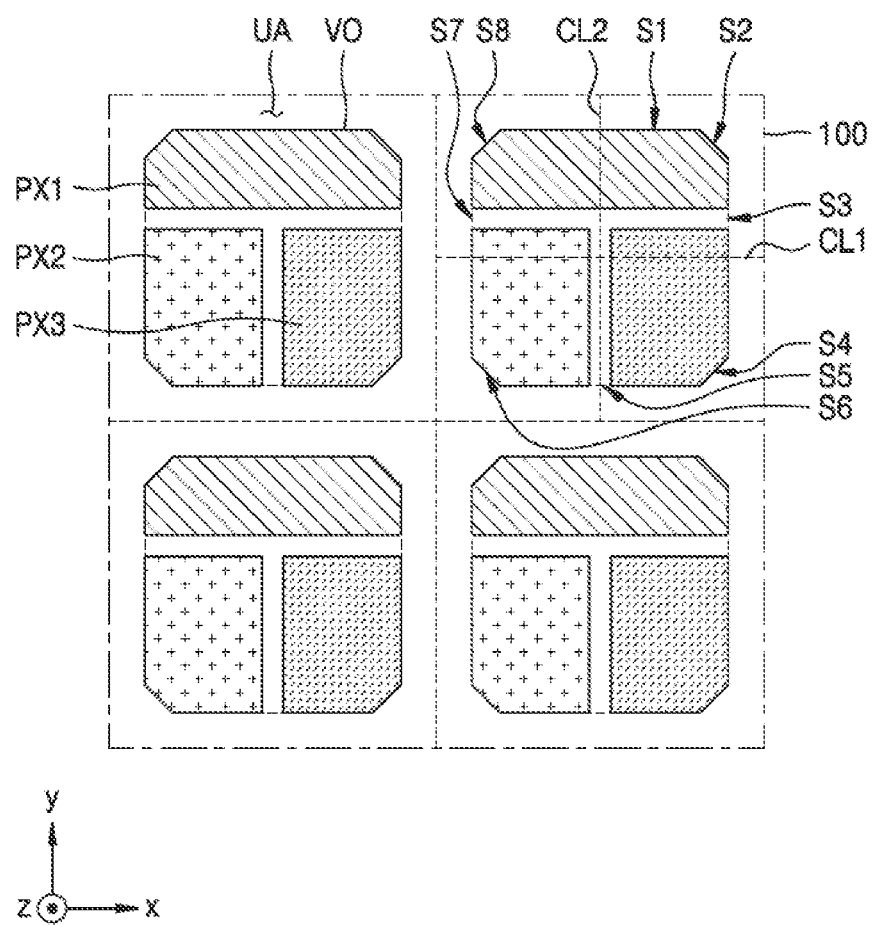
FIGS. 6, 7, and 8 are schematic plan views of a portion of the display apparatus of FIG. 1 according to embodiments.
Figure 7:
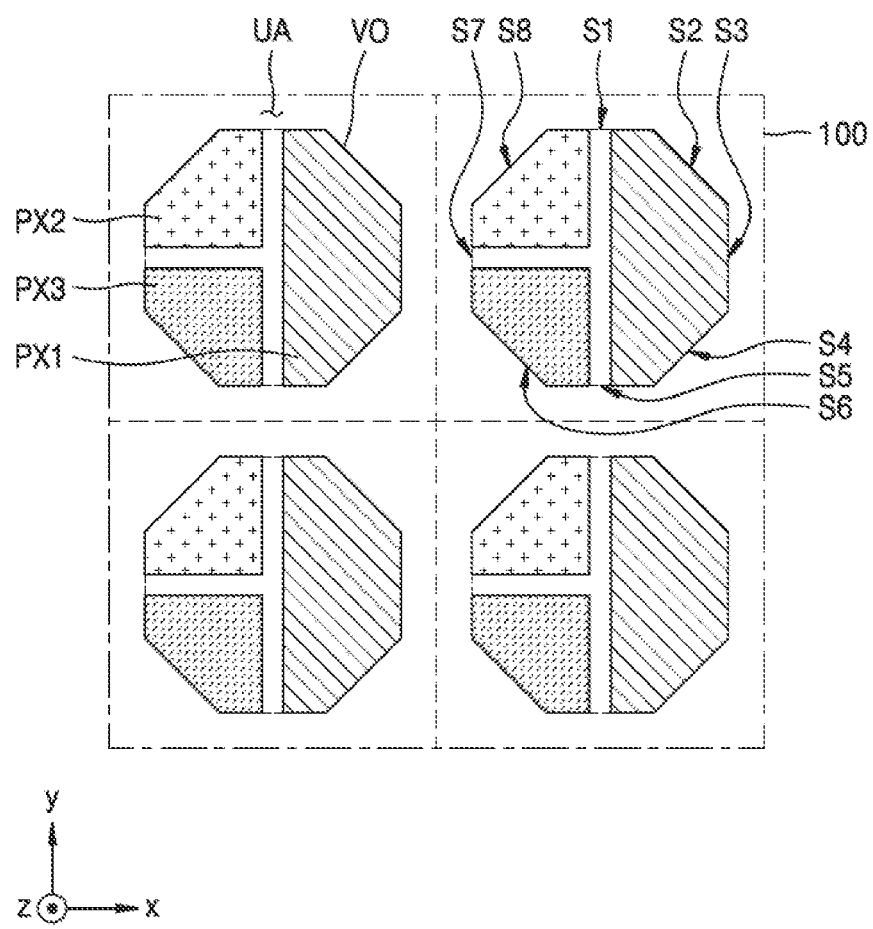
Figure 8:
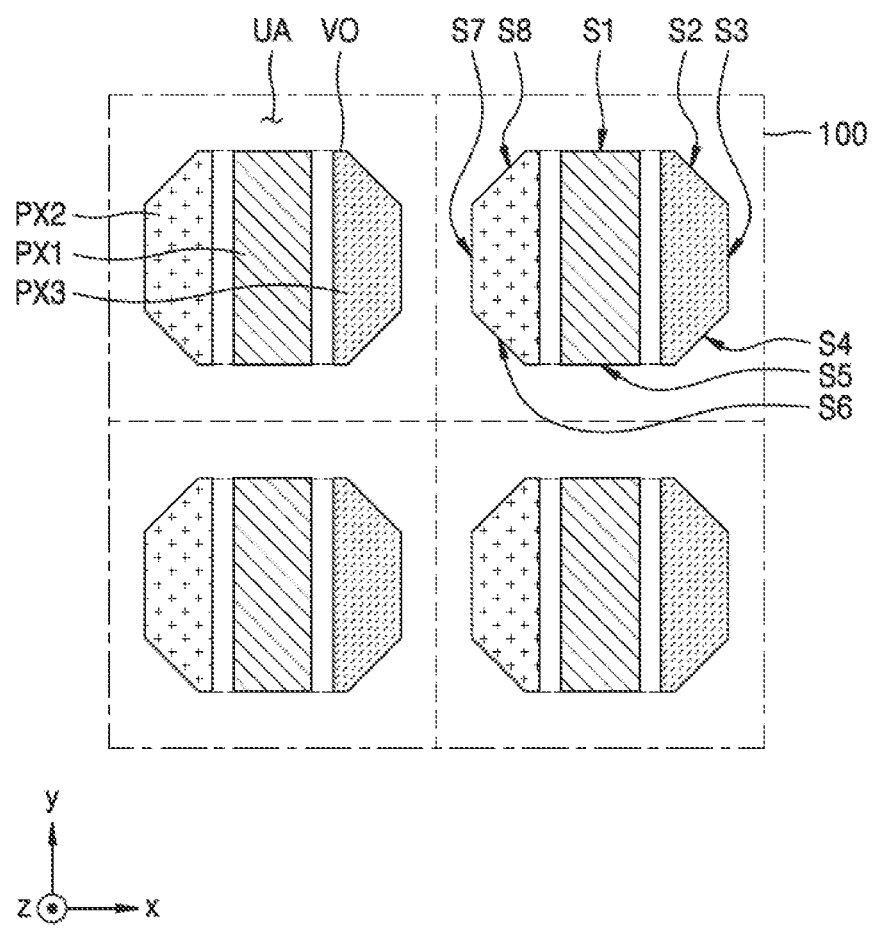

FIGS. 6 to 8 are schematic plan views of a portion of the display apparatus of FIG. 1 according to embodiments.

FIGS. 6 to 8 are schematic plan views of various embodiments similar to the embodiment of FIG. 3, but in which the shape of the virtual octagon VO and the configuration of the first sub-pixel PX1, the second sub-pixel PX2, and the third sub-pixel PX3 are different. Hereinafter, redundant description of same or corresponding elements are omitted for descriptive convenience.

Referring to FIG. 6, the lengths of sides of the virtual octagon VO may be different. As an example, the length of the first side S1 of the virtual octagon VO parallel to the boundary on a side of the unit area UA may be different from the length of the second side S2 facing a vertex of the unit area UA. In an embodiment, as shown in FIG. 6, the lengths of the first side S1, the third side S3, the fifth side S5, and the seventh side S7 may be equal to or greater than the lengths of the second side S2, the fourth side S4, the sixth side S6, and the eighth side S8. In another example, the lengths of the first side S1, the third side S3, the fifth side S5, and the seventh side S7 may be less than the lengths of the second side S2, the fourth side S4, the sixth side S6, and the eighth side S8.

A wall (e.g., a partition wall) separating the first opening 151 from the second opening 152 in the pixel-defining layer 150 may be disposed in a region between the first sub-pixel PX1 and the second sub-pixel PX2. In an embodiment, the wall may pass through the center area (or the center point) of the virtual octagon VO. In another example, the wall may be spaced apart from a first central line CL1 in a first direction (e.g., a y-axis direction) or an opposite direction of the first direction (e.g., the y-axis direction). For example, the first central line CL1 may extend in the second direction (e.g., the x-axis direction) from the center area (or the center point) of the virtual octagon VO.

In an embodiment, a wall (e.g., a partition wall) separating the second opening 152 from the third opening 153 in the pixel-defining layer 150 may be disposed in a region between the second sub-pixel PX2 and the third sub-pixel PX3. An extension line of the wall may pass through the center area (or the center point) of the virtual octagon VO. In another example, the wall may be spaced apart from a second central line CL2 in the second direction (e.g., the x-axis direction) or an opposite direction of the second direction. For example, the second central line CL2 may extend in the first direction (e.g., the y-axis direction) from the center area (or the center point) of the virtual octagon VO. As described above, color scheme of the display apparatus may be optimized by adjusting an area ratio of the first sub-pixel PX1, the second sub-pixel PX2, and the third sub-pixel PX3 inside the virtual octagon VO.

Referring to FIG. 7, in an embodiment, the boundary of the first sub-pixel PX1 may be parallel to the boundary of the unit area UA, and may contact the first side S1 of the virtual octagon VO extending in the second direction (e.g., the x-axis direction), and a second side S2, a third side S3, a fourth side S4, and a fifth side S5 that are sequentially disposed from the first side S1 in a clockwise direction. The boundary of the second sub-pixel PX2 may contact the first side S1 of the virtual octagon VO, an eighth side S8 and a seventh side S7 that are sequentially disposed from the first side S1 in a counterclockwise direction. The boundary of the third sub-pixel PX3 may contact (or overlap) the fifth side S5 of the virtual octagon VO, a sixth side S6 and the seventh side S7 that are sequentially disposed from the fifth side S5 in a clockwise direction. For example, the configuration of the first sub-pixel PX1, the second sub-pixel PX2, and the third sub-pixel PX3 shown in FIG. 7 may be formed by rotating, in the clockwise direction, the configuration of the first sub-pixel PX1, the second sub-pixel PX2, and the third sub-pixel PX3 shown in FIG. 6.

For example, the configuration of the first sub-pixel PX1, the second sub-pixel PX2, and the third sub-pixel PX3 may be formed by rotating, by 180° in the clockwise direction, or by 270° in the clockwise direction, the configuration of the first sub-pixel PX1, the second sub-pixel PX2, and the third sub-pixel PX3 shown in FIG. 6.

In another example, the configuration of the first sub-pixel PX1, the second sub-pixel PX2, and the third sub-pixel PX3 may pass through the center area (or the center point) of the virtual octagon VO, and be symmetrical to the configuration of the first sub-pixel PX1, the second sub-pixel PX2, and the third sub-pixel PX3 shown in FIG. 6 with respect to a straight line extending in the first direction (e.g., the y-axis direction).

In another example, the configuration of the first sub-pixel PX1, the second sub-pixel PX2, and the third sub-pixel PX3 may pass through the center area (or the center point) of the virtual octagon VO, and be symmetrical to the configuration of the first sub-pixel PX1, the second sub-pixel PX2, and the third sub-pixel PX3 shown in FIG. 6 with respect to a straight line extending in the second direction (e.g., the x-axis direction).

Referring to FIG. 8, the boundary of the second sub-pixel PX2 may contact the first side S1 of the virtual octagon VO, the eighth side S8, the seventh side S7, the sixth side S6, and the fifth side S5 that are sequentially disposed from the first side S1 in the counterclockwise direction. The boundary of the third sub-pixel PX3 may contact the first side S1 of the virtual octagon VO, the second side S2, the third side S3, the fourth side S4, and the fifth side S5 that are sequentially disposed from the first side S1 in the clockwise direction. The first sub-pixel PX1 may be disposed between the second sub-pixel PX2 and the third sub-pixel PX3.

For example, the wall between the first opening 151 that defines the boundary of the first sub-pixel PX1 and the second opening 152 that defines the boundary of the second sub-pixel PX2 may divide the virtual octagon VO in the first direction (e.g., the y-axis direction). Further, the wall between the second opening 152 that defines the boundary of the second sub-pixel PX2 and the third opening 153 that defines the boundary of the third sub-pixel PX3 may divide the virtual octagon VO in the first direction (e.g., the y-axis direction).

In an embodiment, the boundary of the second sub-pixel PX2 may contact the first side S1 of the virtual octagon VO and the fifth side S5 parallel to the first side S1. In another example, the boundary of the second sub-pixel PX2 may not contact any sides of the virtual octagon VO.

Although FIG. 8 illustrates that the first sub-pixel PX1 is arranged between the second sub-pixel PX2 and the third sub-pixel PX3, the second sub-pixel PX2 may be arranged between the first sub-pixel PX1 and the third sub-pixel PX3, or the third sub-pixel PX3 may be arranged between the first sub-pixel PX1 and the second sub-pixel PX2. For example, the configuration of the first sub-pixel PX1, the second sub-pixel PX2, and the third sub-pixel PX3 may be rotated by about 90°, about 180°, or about 270° in the clockwise direction.

Figure 9:
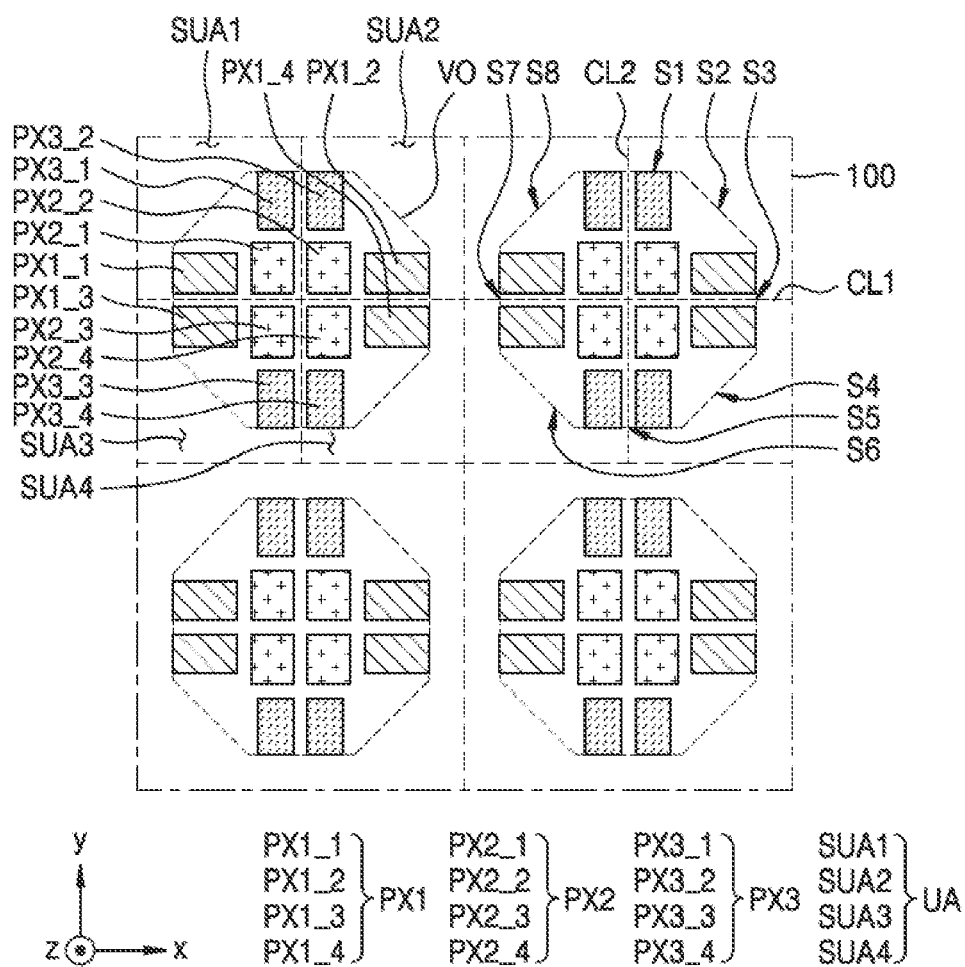
FIG. 9 is a schematic plan view of a portion of the display apparatus of FIG. 1 according to an embodiment.
Figure 10:
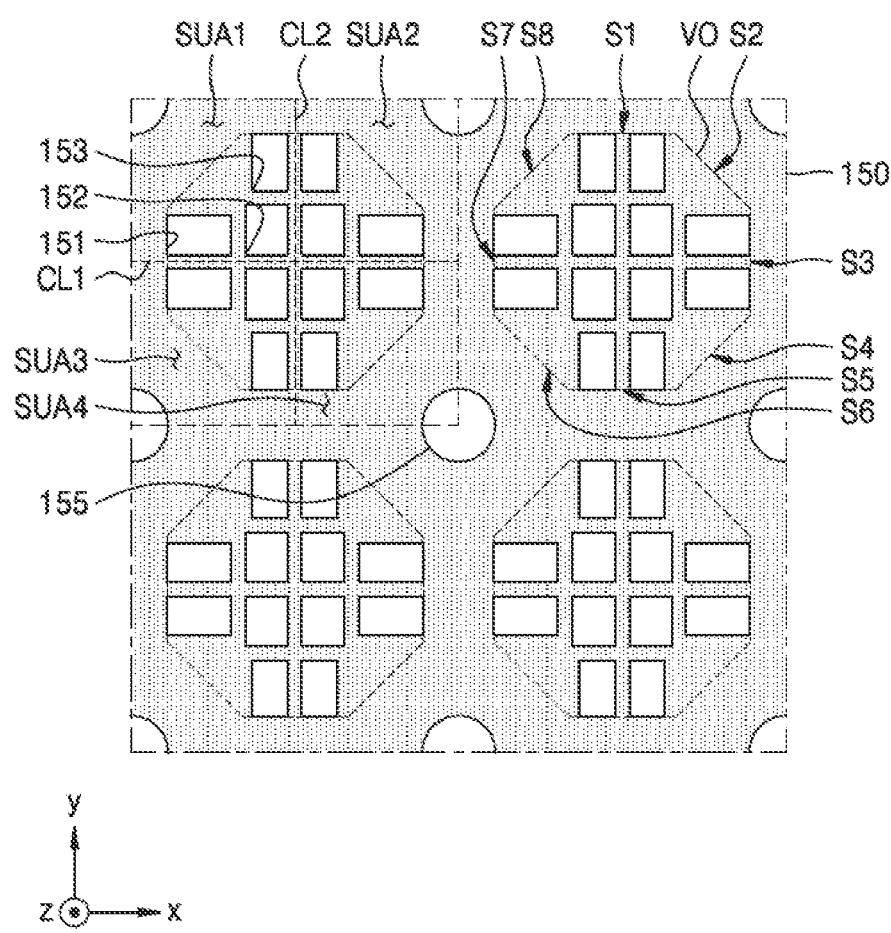
FIG. 10 is a schematic plan view of a pixel-defining layer of the display apparatus of FIG. 9.

FIG. 9 is a schematic plan view of a portion of the display apparatus of FIG. 1 according to an embodiment, FIG. 10 is a schematic plan view of the pixel-defining layer of the display apparatus of FIG. 9.

Referring to FIG. 9, the unit area UA may include the virtual octagon VO, a first sub-unit area SUA1, a second sub-unit area SUA2, a third sub-unit area SUA3, and a fourth sub-unit area SUA4 that divide (e.g., equally divide) the virtual octagon VO into four parts. As an example, the unit area UA may be divided into the first sub-unit area SUA1, the second sub-unit area SUA2, the third sub-unit area SUA3, and the fourth sub-unit area SUA4 by the first central line CL1 and the second central line CL2. For example, the first central line CL1 may pass through the center area (or the center point) of the virtual octagon VO and may extend in the second direction (e.g., the x-axis direction). The second central line CL2 may pass through the center area (or the center point) of the virtual octagon VO and may extend in the first direction (e.g., the y-axis direction). Each of the first sub-unit area SUA1, the second sub-unit area SUA2, the third sub-unit area SUA3, and the fourth sub-unit area SUA4 may include the first sub-pixel PX1, the second sub-pixel PX2, and the third sub-pixel PX3. For example, the first sub-pixel PX1 may include a first-first sub-pixel PX1_1 in the first sub-unit area SUA1, a first-second sub-pixel PX1_2 in the second sub-unit area SUA2, a first-third sub-pixel PX1_3 in the third sub-unit area SUA3, and a first-fourth sub-pixel PX1_4 in the fourth sub-unit area SUA4. For example, the second sub-pixel PX2 may include a second-first sub-pixel PX2_1 in the first sub-unit area SUA1, a second-second sub-pixel PX2_2 in the second sub-unit area SUA2, a second-third sub-pixel PX2_3 in the third sub-unit area SUA3, and a second-fourth sub-pixel PX2_4 in the fourth sub-unit area SUA4. For example, the third sub-pixel PX3 may include a third-first sub-pixel PX3_1 in the first sub-unit area SUA1, a third-second sub-pixel PX3_2 in the second sub-unit area SUA2, a third-third sub-pixel PX3_3 in the third sub-unit area SUA3, and a third-fourth sub-pixel PX3_4 in the fourth sub-unit area SUA4.

In an embodiment, the first side S1 of the virtual octagon VO parallel to the boundary of the unit area UA may be divided (e.g., equally divided) by the first sub-unit area SUA1 and the second sub-unit area SUA2. A portion of the first side S1, the eighth side S8, and a portion the seventh side S7 sequentially disposed in the counterclockwise direction may be disposed in the first sub-unit area SUA1.

In an embodiment, the first sub-pixel PX1 (e.g., the first-first sub-pixel PX1_1) arranged in the first sub-unit area SUA1 may contact the seventh side S7 of the virtual octagon VO, and the third sub-pixel PX3 (e.g., the third-first sub-pixel PX3_1) arranged in the first sub-unit area SUA1 may contact (or overlap) the first side S1 of the virtual octagon VO. The second sub-pixel PX2 (e.g., the second-first sub-pixel PX2_1) arranged in the first sub-unit area SUA1 may be adjacent to the center area (or the center point) of the virtual octagon VO to be spaced apart from the first-first sub-pixel PX1_1 and the third-first sub-pixel PX3_1.

The configuration of the first sub-pixel PX1 (e.g., the first-second sub-pixel PX1_2), the second sub-pixel PX2 (e.g., the second-second sub-pixel PX2_2), and the third sub-pixel PX3 (e.g., the third-second sub-pixel PX3_2) arranged in the second sub-unit area SUA2 may be point-symmetrical to the configuration of the first sub-pixel PX1 (e.g., the first-first sub-pixel PX1_1), the second sub-pixel PX2 (e.g., the second-first sub-pixel PX2_1), and the third sub-pixel PX3 (e.g., the third-first sub-pixel PX3_1) arranged in the first sub-unit area SUA1 with respect to the second central line CL2.

The configuration of the first sub-pixel PX1 (e.g., the first-third sub-pixel PX1_3), the second sub-pixel PX2 (e.g., the second-third sub-pixel PX2_3), and the third sub-pixel PX3 (e.g., the third-third sub-pixel PX3_3) arranged in the third sub-unit area SUA3 may be point-symmetrical to the configuration of the first sub-pixel PX1 (e.g., the first-first sub-pixel PX1_1), the second sub-pixel PX2 (e.g., the second-first sub-pixel PX2_1), and the third sub-pixel PX3 (e.g., the third-first sub-pixel PX3_1) arranged in the first sub-unit area SUA1 with respect to the first central line CL1.

The configuration of the first sub-pixel PX1 (e.g., the first-fourth sub-pixel PX1_4), the second sub-pixel PX2 (e.g., the second-fourth sub-pixel PX2_4), and the third sub-pixel PX3 (e.g., the third-fourth sub-pixel PX3_4) arranged in the fourth sub-unit area SUA4 may be point-symmetrical to the configuration of the first sub-pixel PX1 (e.g., the first-first sub-pixel PX1_1), the second sub-pixel PX2 (e.g., the second-first sub-pixel PX2_1), and the third sub-pixel PX3 (e.g., the third-first sub-pixel PX3_1) arranged in the first sub-unit area SUA1 with respect to the center area (or the center point) of the virtual octagon VO.

Referring to FIG. 10, the pixel-defining layer 150 may include the first openings 151 corresponding to (e.g., overlapping) the first sub-pixels PX1, the second openings 152 corresponding to (e.g., overlapping) the second sub-pixels PX2, the third openings 153 corresponding to (e.g., overlapping) the third sub-pixels PX3, and the fourth openings 155.

Each of the first sub-unit area SUA1, the second sub-unit area SUA2, the third sub-unit area SUA3, and the fourth sub-unit area SUA4 may include the first opening 151, the second opening 152, and the third opening 153.

The first opening 151 arranged in the first sub-unit area SUA1 may contact the seventh side S7 of the virtual octagon VO, and the third opening 153 may contact the first side S1 of the virtual octagon VO. The second opening 152 may be adjacent to the center area (or the center point) of the virtual octagon VO to be spaced apart from the first opening 151 and the third opening 153.

The configuration of the first opening 151, the second opening 152, and the third opening 153 arranged in the second sub-unit area SUA2 may be line-symmetrical to the configuration of the first opening 151, the second opening 152, and the third opening 153 arranged in the first sub-unit area SUA1 with respect to the second central line CL2.

The configuration of the first opening 151, the second opening 152, and the third opening 153 arranged in the third sub-unit area SUA3 may be line-symmetrical to the configuration of the first opening 151, the second opening 152, and the third opening 153 arranged in the first sub-unit area SUA1 with respect to the first central line CL1.

The configuration of the first opening 151, the second opening 152, and the third opening 153 arranged in the fourth sub-unit area SUA4 may be point-symmetrical to the configuration of the first opening 151, the second opening 152, and the third opening 153 arranged in the first sub-unit area SUA1 with respect to the center area (or the center point) of the virtual octagon VO.

The fourth opening 155 may overlap the respective vertexes of the unit area UA. In an embodiment, the center area (or the center point) of the fourth opening 155 may overlap the respective vertexes of the unit area UA. Accordingly, two sub-unit areas may be arranged between the fourth openings 155 adjacent to each other.

Figure 11:
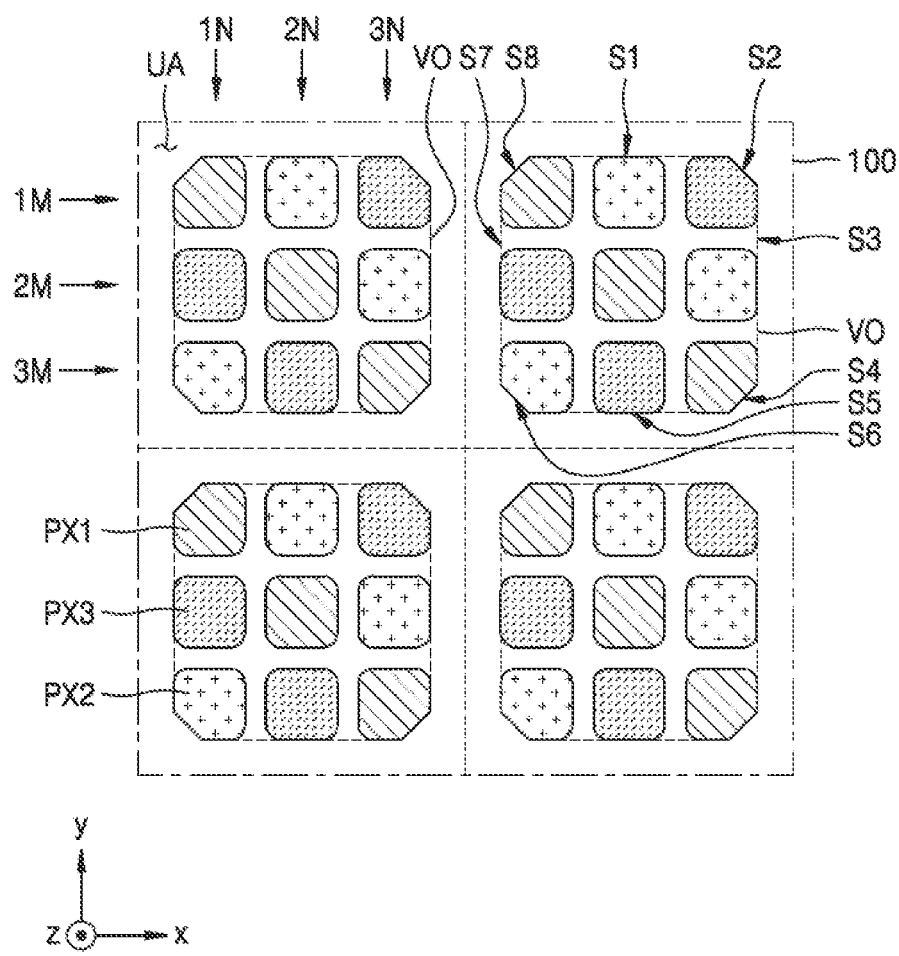
FIG. 11 is a schematic plan view of a portion of the display apparatus of FIG. 1 according to an embodiment.

FIG. 11 is a schematic plan view of a portion of the display apparatus of FIG. 1 according to an embodiment.

Referring to FIG. 11, the unit area UA may include the virtual octagon VO. For example, each of a first sub-pixel PX1, a second sub-pixel PX2, and a third sub-pixel PX3 may be provided in plural. For example, the plurality of first sub-pixels PX1, the plurality of second sub-pixels PX2, and the plurality of third sub-pixels PX3 may be arranged inside the virtual octagon VO.

In an embodiment, the first sub-pixels PX1, the second sub-pixels PX2, and the third sub-pixels PX3 may be arranged in a 3×3-matrix having three columns and three rows inside the virtual octagon VO. The first sub-pixel PX1 disposed at (1M, 1N) may contact the first side S1 of the virtual octagon VO, the eighth side S8 and the seventh side S7 that are sequentially disposed from the first side S1 in the counterclockwise direction. The second sub-pixel PX2 disposed at (1M, 2N) may contact the first side S1 of the virtual octagon VO. The third sub-pixel PX3 disposed at (1M, 3N) may contact the first side S1 of the virtual octagon VO, the second side S2 and the third side S3 that are sequentially disposed from the first side S1 in the clockwise direction.

The third sub-pixel PX3 disposed at (2M, 1N) may contact the seventh side S7 of the virtual octagon VO. The first sub-pixel PX1 disposed at (2M, 2N) may not contact any side of the virtual octagon VO. The second sub-pixel PX2 disposed at (2M, 3N) may contact the third side S3 of the virtual octagon VO.

The second sub-pixel PX2 disposed at (3M, 1N) may contact the fifth side S5, the sixth side S6, and the seventh side S7 of the virtual octagon VO. The third sub-pixel PX3 disposed at (3M, 2N) may contact the fifth side S5 of the virtual octagon VO. The first sub-pixel PX1 disposed at (3M, 3N) may contact the third side S3, the fourth side S4, and the fifth side S5 of the virtual octagon VO.

One of rows of the 3×3-matrix may include all of the first sub-pixel PX1, the second sub-pixel PX2, and the third sub-pixel PX3. Further, one of columns of the 3×3-matrix may include all of the first sub-pixel PX1, the second sub-pixel PX2, and the third sub-pixel PX3. Both the second sub-pixel PX2 and the third sub-pixel PX3 may be arranged along each side of the virtual octagon VO parallel to each boundary of the unit area UA. Accordingly, in case that the display apparatus is driven to display a black or white image, a phenomenon that mixed colors of R/B, R/G, or G/B is recognized or viewed at the boundary surface of the unit area UA may be reduced.

Figure 12:
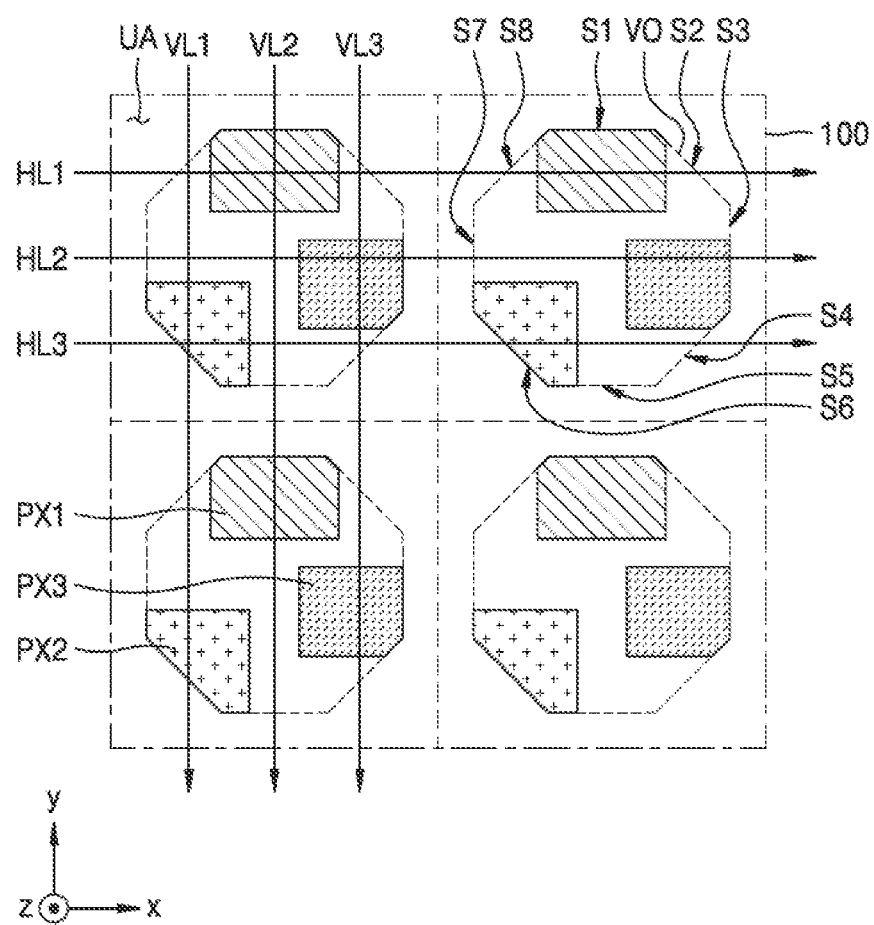
FIG. 12 is a schematic plan view of a portion of the display apparatus of FIG. 1 according to an embodiment.
Figure 14:
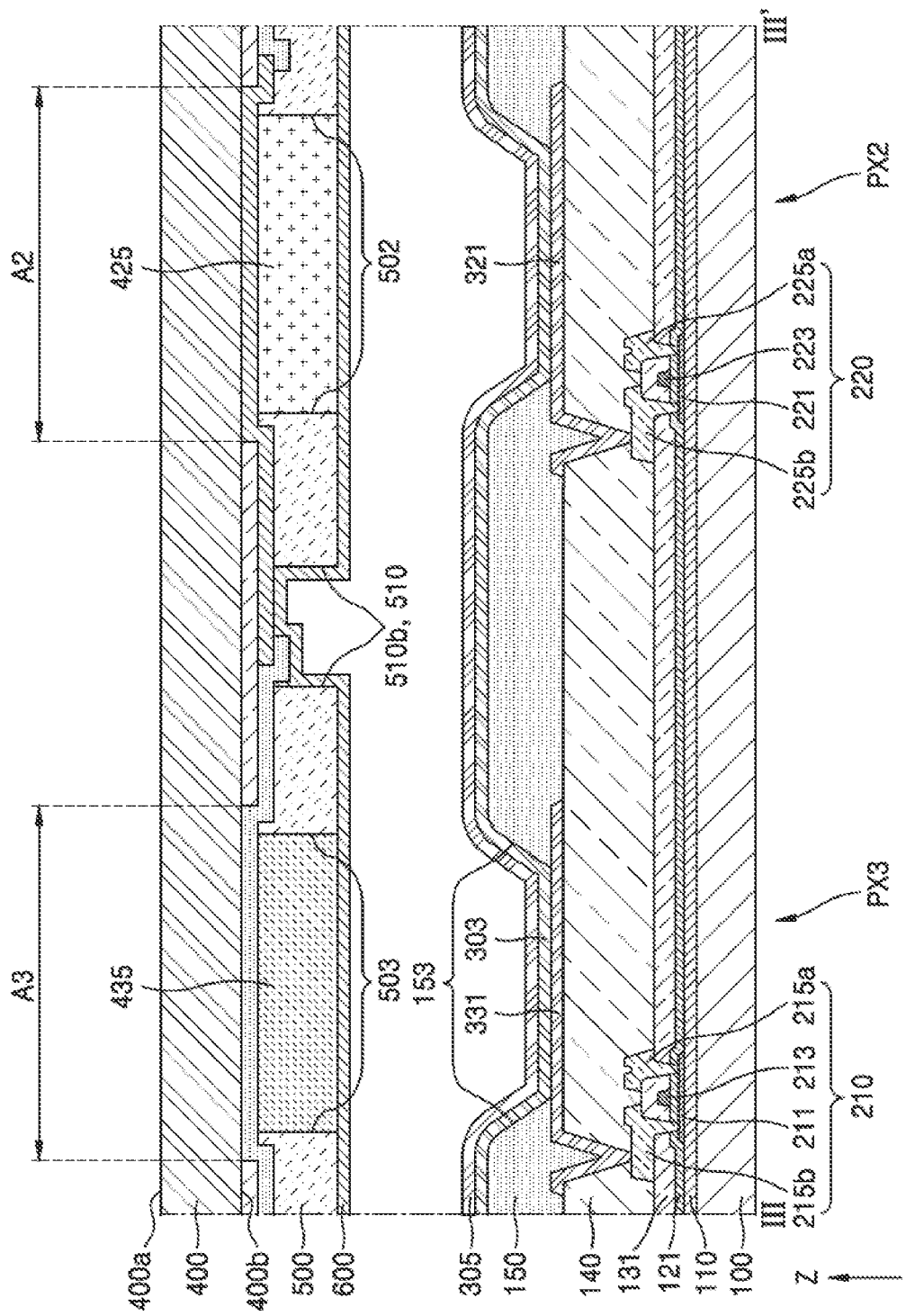
FIG. 14 is a schematic cross-sectional view of the display apparatus, taken along line III-III' of FIG. 12.

FIG. 12 is a schematic plan view of a portion of the display apparatus of FIG. 1 according to an embodiment, and FIG. 13 is a schematic plan view of the bank layer of the display apparatus of FIG. 12. FIG. 14 is a schematic cross-sectional view of the bank layer, taken along line III-III' of FIG. 12.

Referring to FIG. 12, the first substrate 100 may have a unit area UA having a quadrangular shape. A virtual octagon VO may be disposed inside the unit area UA. For example, the virtual octagon VO may have a center coinciding with the center area (or the center point) of the unit area UA and may have sides spaced apart inward from the boundary of the unit area UA. In an embodiment, a first side S1 of the virtual octagon VO may be parallel to a boundary on a side of the unit area UA. In case that the sides of the virtual octagon VO are respectively defined as first, second, third, fourth, fifth, sixth, seventh, and eighth sides S1, S2, S3, S4, S5, S6, S7, and S8 that are sequentially disposed in a clockwise direction, the first side S1, the third side S3, the fifth side S5, and the seventh side S7 may be respectively parallel to the boundaries of the unit area UA. However, embodiments are not limited thereto.

The unit area UA may include first, second, and third vertical lines (e.g., first, second, and third virtual vertical lines) VL1, VL2, and VL3, and first, second, and third horizontal lines (e.g., first, second, and third virtual horizontal lines) HL1, HL2, and HL3. For example, the first to third vertical lines VL1, VL2, and VL3 may pass through the virtual octagon VO in the first direction (e.g., the y-axis direction) and may be spaced apart from each other. The first, second, and third horizontal lines HL1, HL2, and HL3 may pass through the virtual octagon VO in the second direction (e.g., the x-axis direction) and may be spaced apart from each other.

The boundary of the first sub-pixel PX1 may contact the first side S1, the second side S2, and the eighth side S8 of the virtual octagon VO. For example, the second side S2 may be adjacent to the first side S1 in the clockwise direction, and the eighth side S8 may be adjacent to the first side S1 in the counterclockwise direction. For example, the first sub-pixel PX1 may overlap one of the first, second, and third vertical lines VL1, VL2, and VL3, and may not overlap the rest of the first, second, and third vertical lines VL1, VL2, and VL3. Further, the first sub-pixel PX1 may overlap one of the first, second, and third horizontal lines HL1, HL2, and HL3, and may not overlap the rest of the first, second, and third horizontal lines HL1, HL2, and HL3. As an example, as shown in FIG. 12, the first sub-pixel PX1 may overlap the second vertical line VL2 and the first horizontal line HL1, and may not overlap the rest of the vertical lines and the horizontal lines.

The boundary of the second sub-pixel PX2 may contact the fifth side S5, the sixth side S6, and the seventh side S7. For example, the fifth side S5 may be parallel to the first side S1 of the virtual octagon VO, and the sixth side S6 and the seventh side S7 may be adjacent to the fifth side S5 in the clockwise direction. For example, the second sub-pixel PX2 may overlap one of the first to third vertical lines VL1, VL2, and VL3, and may not overlap the rest of the first to third vertical lines VL1, VL2, and VL3. Further, the second sub-pixel PX2 may overlap one of the first to third horizontal lines HL1, HL2, and HL3, and may not overlap the rest of the first to third horizontal lines HL1, HL2, and HL3. As an example, as shown in FIG. 12, the second sub-pixel PX2 may overlap the first vertical line VL1 and the third horizontal line HL3, and may not overlap the rest of the vertical lines and the horizontal lines.

The boundary of the third sub-pixel PX3 may contact the third side S3 and the fourth side S4 of the virtual octagon VO that are sequentially disposed from the second side S2 in a clockwise direction. For example, the third sub-pixel PX3 may overlap one of the first to third vertical lines VL1, VL2, and VL3, and may not overlap the rest of the first to third vertical lines VL1, VL2, and VL3. Further, the third sub-pixel PX3 may overlap one of the first to third horizontal lines HL1, HL2, and HL3, and may not overlap the rest of the first to third horizontal lines HL1, HL2, and HL3. As an example, as shown in FIG. 12, the third sub-pixel PX3 may overlap the third vertical line VL3 and the second horizontal line HL2, and may not overlap the rest of the vertical lines and the horizontal lines.

For example, one vertical line and one horizontal line may be arranged to pass through only one sub-pixel. In an embodiment, the second vertical line VL2 and the first horizontal line HL1 may correspond to a movement line of a spray nozzle for forming the first quantum-dot layer 415 by using an inkjet printing process. The first vertical line VL1 and the third horizontal line HL3 may correspond to a movement line of a spray nozzle for forming the second quantum-dot layer 425 by using an inkjet printing process. The third vertical line VL3 and the second horizontal line HL2 may correspond to a movement line of a spray nozzle for forming the light-transmissive layer 435 by using an inkjet printing process. Accordingly, in case that the first quantum-dot layer 415, the second quantum-dot layer 425, and the light-transmissive layer 435 are formed, color mixing of each sub-pixel due to erroneous dotting may be prevented.

Referring to FIGS. 13 and 14, the bank layer 500 may include first holes 501, second holes 502, third holes 503, and auxiliary holes 510.

The first hole 501 of the bank layer 500 may correspond to (e.g., overlap) the first opening 151 of the pixel-defining layer 150. The second hole 502 of the bank layer 500 may correspond to (e.g., overlap) the second opening 152 of the pixel-defining layer 150. The third hole 503 of the bank layer 500 may correspond to (e.g., overlap) the third opening 153 of the pixel-defining layer 150. For example, when viewed in a direction (e.g., a z-axis direction) perpendicular to an upper surface 400a of the second substrate 400, the first hole 501 of the bank layer 500 may overlap the first opening 151 of the pixel-defining layer 150 that exposes the first pixel electrode 311, the second hole 502 of the bank layer 500 may overlap the second opening 152 of the pixel-defining layer 150 that exposes the second pixel electrode 321, and the third hole 503 of the bank layer 500 may overlap the third opening 153 of the pixel-defining layer 150 that exposes the third pixel electrode 331. Accordingly, when viewed in the direction (e.g., the z-axis direction) perpendicular to the upper surface 400a of the second substrate 400, the shape of the edges of each of the first to third holes 501, 502, and 503 of the bank layer 500 may be the same as or similar to the shape of the edges of the first to third openings 151, 152, and 153 of the pixel-defining layer 150 corresponding thereto. Accordingly, the first hole 501 of the bank layer 500 may correspond to (e.g., overlap) the first pixel electrode 311, the second hole 502 of the bank layer 500 may correspond to the second pixel electrode 321, and the third hole 503 of the bank layer 500 may correspond to (e.g., overlap) the third pixel electrode 331.

The auxiliary holes 510 may be arranged between adjacent sub-pixels. In an embodiment, a first auxiliary hole 510a may be arranged between the second holes 502 adjacent to each other along the first vertical line VL1. A second auxiliary hole 510b may be arranged between the first holes 501 adjacent to each other along the second vertical line VL2. A third auxiliary hole 510c may be arranged between the third holes 503 adjacent to each other along the third vertical line VL3. Fourth auxiliary holes 510d may be arranged along the boundary of the unit area UA extending in the first direction (e.g., the y-axis direction). In the case where there is no material inside the auxiliary hole 510, the protective layer 600 may contact the inner surface and the lower surface of the auxiliary holes 510 as shown in FIG. 14.

During a process of dotting the material for forming the first quantum-dot layer 415 using an inkjet printing process, the material may not be disposed in the first hole 501, and during a process of dotting the material for forming the second quantum-dot layer 425, the material may not be disposed in the second hole 502. For example, the bank layer 500 may include the auxiliary holes 510 in the display apparatus according to the embodiment in order to to reduce a probability that the material for forming the first quantum-dot layer 415 is disposed in the second hole 502 or the third hole 503, and to reduce a probability that the material for forming the second quantum-dot layer 425 is disposed in the first hole 501 or the third hole 503.

Accordingly, even though the material is not disposed inside the first hole 501 during the process of dotting the material for forming the first quantum-dot layer 415 using an inkjet printing process, the material may be disposed inside the auxiliary hole 510, and thus, the probability that the material is disposed in the second hole 502 or the third hole 503 may be reduced. For example, even though the material is not disposed inside the second hole 502 during the process of dotting the material for forming the second quantum-dot layer 425 using an inkjet printing process, the material may be disposed inside the auxiliary hole 510, and thus, the probability that the material is disposed in the first hole 501 or the third hole 503 may be reduced.

Figure 15:
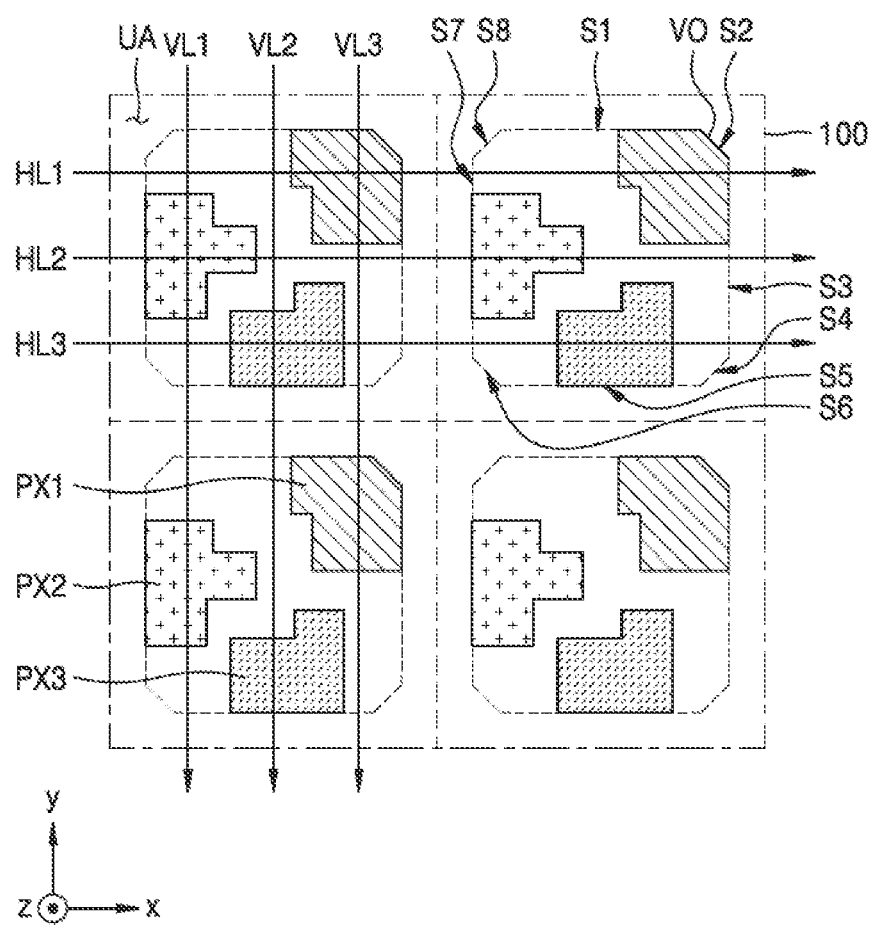
FIG. 15 is a schematic plan view of a portion of the display apparatus of FIG. 1 according to an embodiment.

FIG. 15 is a schematic plan view of a portion of the display apparatus of FIG. 1 according to an embodiment, and FIG. 16 is a schematic plan view of the bank layer of the display apparatus of FIG. 15.

In FIG. 15, similar to FIG. 12, the unit area UA may include the first to third vertical lines VL1, VL2, and VL3, and the first to third horizontal lines HL1, HL2, and HL3. For example, the first to third vertical lines VL1, VL2, and VL3 may pass through the virtual octagon VO in the first direction (e.g., the y-axis direction) and may be spaced apart from each other, and the first to third horizontal lines HL1, HL2, and HL3 may pass through the virtual octagon VO in the second direction (e.g., the x-axis direction) and may be spaced apart from each other.

The boundary of the first sub-pixel PX1 may contact the first side S1 of the virtual octagon VO, the second side S2 and the third side S3 that are adjacent to the first side S1 in the clockwise direction. For example, the first sub-pixel PX1 may overlap one of the first to third vertical lines VL1, VL2, and VL3, and may not overlap the rest of the first to third vertical lines VL1, VL2, and VL3. Further, the first sub-pixel PX1 may overlap one of the first to third horizontal lines HL1, HL2, and HL3, and may not overlap the rest of the first to third horizontal lines HL1, HL2, and HL3. As an example, as shown in FIG. 12, the first sub-pixel PX1 may overlap the third vertical line VL3 and the first horizontal line HL1, and may not overlap the rest of the vertical lines and the horizontal lines.

The boundary of the second sub-pixel PX2 may contact the seventh side S7 of the virtual octagon VO. For example, the second sub-pixel PX2 may overlap one of the first to third vertical lines VL1, VL2, and VL3, and may not overlap the rest of the first to third vertical lines VL1, VL2, and VL3. Further, the second sub-pixel PX2 may overlap one of the first to third horizontal lines HL1, HL2, and HL3, and may not overlap the rest of the first to third horizontal lines HL1, HL2, and HL3. As an example, as shown in FIG. 12, the second sub-pixel PX2 may overlap the first vertical line VL1 and the second horizontal line HL2, and may not overlap the rest of the vertical lines and the horizontal lines.

The boundary of the third sub-pixel PX3 may contact the fifth side S5 of the virtual octagon VO. For example, the third sub-pixel PX3 may overlap one of the first to third vertical lines VL1, VL2, and VL3, and may not overlap the rest of the first to third vertical lines VL1, VL2, and VL3. Further, the third sub-pixel PX3 may overlap one of the first to third horizontal lines HL1, HL2, and HL3, and may not overlap the rest of the first to third horizontal lines HL1, HL2, and HL3. As an example, as shown in FIG. 12, the third sub-pixel PX3 may overlap the second vertical line VL2 and the third horizontal line HL3, and may not overlap the rest of the vertical lines and the horizontal lines.

For example, one vertical line and one horizontal line may be arranged to pass through only one sub-pixel. In an embodiment, the third vertical line VL3 and the first horizontal line HL1 may correspond to a movement line of a spray nozzle for forming the first quantum-dot layer 415 by using an inkjet printing process. The first vertical line VL1 and the first horizontal line HL1 may correspond to a movement line of a spray nozzle for forming the second quantum-dot layer 425 by using an inkjet printing process. The second vertical line VL2 and the third horizontal line HL3 may correspond to a movement line of a spray nozzle for forming the light-transmissive layer 435 by using an inkjet printing process.

Referring to FIG. 16, the bank layer 500 may include the first holes 501, the second holes 502, the third holes 503, and auxiliary holes 520.

The first hole 501 of the bank layer 500 may correspond to (e.g., overlap) the first opening 151 of the pixel-defining layer 150, the second hole 502 of the bank layer 500 may correspond to (e.g., overlap) the second opening 152 of the pixel-defining layer 150, and the third hole 503 of the bank layer 500 may correspond to (e.g., overlap) the third opening 153 of the pixel-defining layer 150. For example, when viewed in a direction (e.g., a z-axis direction) perpendicular to an upper surface 400a of the second substrate 400, the first hole 501 of the bank layer 500 may overlap the first opening 151 of the pixel-defining layer 150 that exposes the first pixel electrode 311, the second hole 502 of the bank layer 500 may overlap the second opening 152 of the pixel-defining layer 150 that exposes the second pixel electrode 321, and the third hole 503 of the bank layer 500 may overlap the third opening 153 of the pixel-defining layer 150 that exposes the third pixel electrode 331. Accordingly, when viewed in the direction (e.g., the z-axis direction) perpendicular to the upper surface 400a of the second substrate 400, the shape of the edges of each of the first to third holes 501, 502, and 503 of the bank layer 500 may be the same as or similar to the shape of the edges of the first to third openings 151, 152, and 153 of the pixel-defining layer 150 corresponding thereto. Accordingly, the first hole 501 of the bank layer 500 may correspond to (e.g., overlap) the first pixel electrode 311, the second hole 502 of the bank layer 500 may correspond to (e.g., overlap) the second pixel electrode 321, and the third hole 503 of the bank layer 500 may correspond to (e.g., overlap) the third pixel electrode 331.

The auxiliary holes 520 may be arranged between adjacent sub-pixels. In an embodiment, a first auxiliary hole 520a may overlap the boundary of the unit area UA parallel to the second direction (e.g., the x-axis direction). A second auxiliary hole 520b may overlap the boundary of the unit area UA parallel to the first direction (e.g., the y-axis direction). A third auxiliary hole 520c may overlap the first horizontal line HL1. A fourth auxiliary hole 520d may be arranged in a region between the first hole 501 and the second hole 502 along the second direction (e.g., the x-axis direction). A fifth auxiliary hole 520e may be arranged in a region between the first hole 501 and the third hole 503 along the second direction (e.g., the x-axis direction). A fifth auxiliary hole 520e may overlap the second horizontal line HL2. A sixth auxiliary hole 520f may be arranged in a region between the second hole 502 and the third hole 503 along the second direction (e.g., the x-axis direction). A seventh auxiliary hole 520g may be arranged in a region between the second hole 502 and the third hole 503, and may overlap a crossing point of the first vertical line VL1 and the third horizontal line HL3. In another example, some of the auxiliary holes 520 may be omitted or the auxiliary holes 520 may be further added, and the shape of the auxiliary hole 520 may be modified or varied.

Since the first sub-pixel PX1, the second sub-pixel PX2, and the third sub-pixel PX3 are arranged as described above, the aperture ratio of the sub-pixels may be increased, and color mixing due to erroneous dotting or flooding of the first quantum-dot layer 415, the second quantum-dot layer 425, and the light-transmissive layer 435 may be prevented or minimized.

Figure 17:
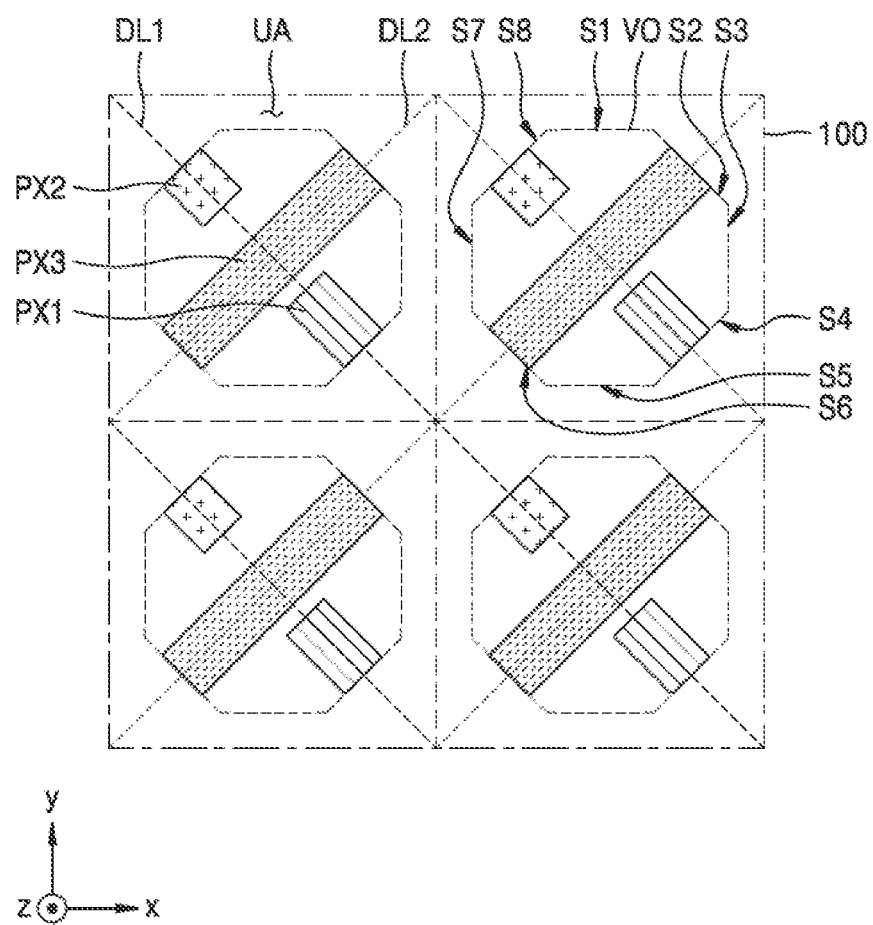
FIGS. 17, 18, and 19 are schematic plan views of a portion of the display apparatus of FIG. 1 according to embodiments.
Figure 18:
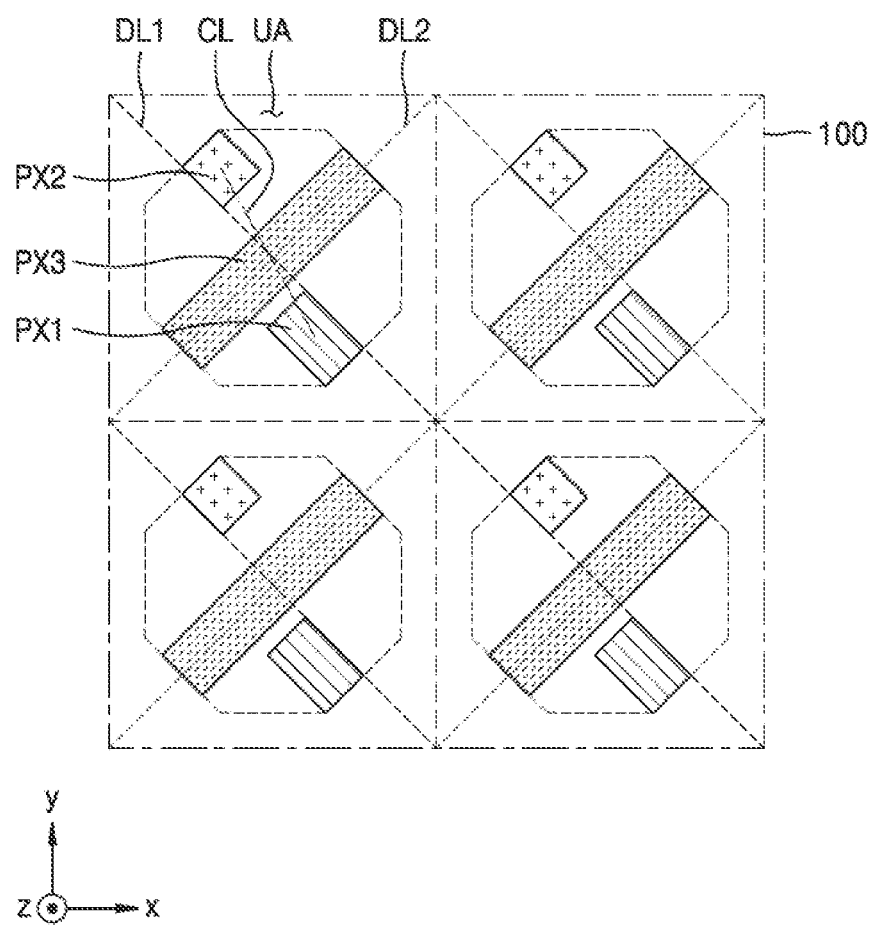
Figure 19:
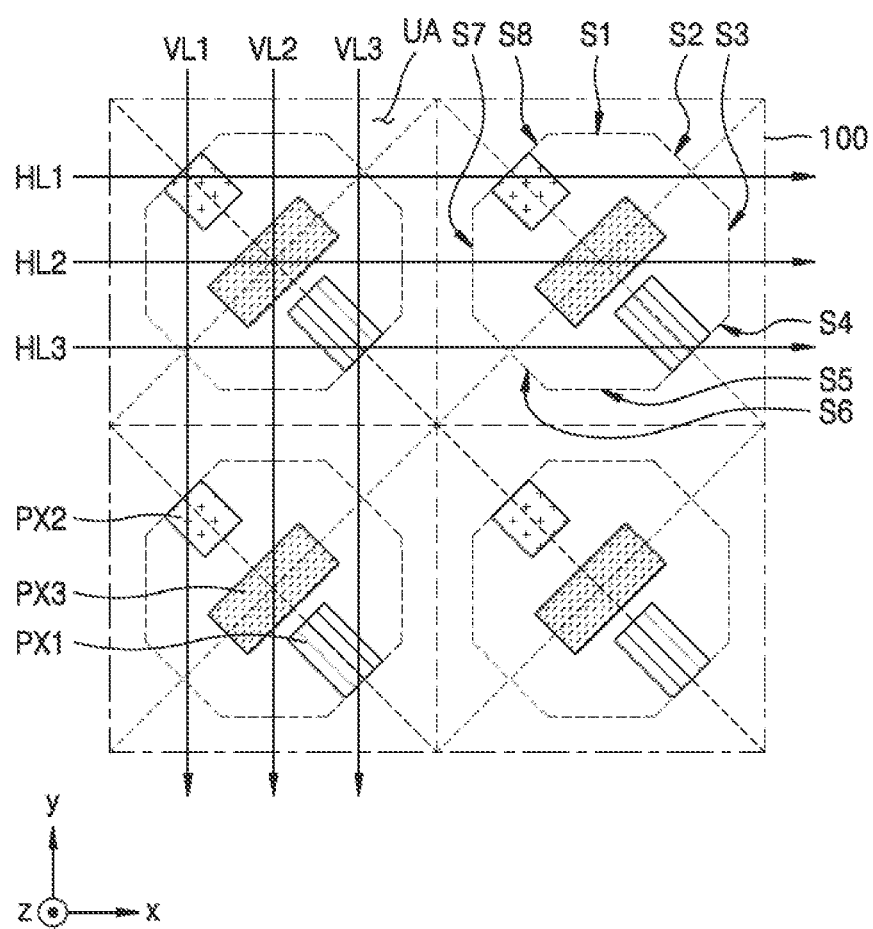

FIGS. 17 to 19 are schematic plan views of a portion of the display apparatus of FIG. 1 according to an embodiment, and FIG. 20 is a schematic plan view of the bank layer of the display apparatus of FIG. 19.

Referring to FIG. 17, the unit area UA may include the virtual octagon VO, a first virtual diagonal line DL1, and a second virtual diagonal line DL2. For example, the second and second virtual diagonal lines DL1 and DL2 may pass through the center area (or the center point) of the virtual octagon VO and the vertexes of the unit area UA.

The first sub-pixel PX1 and the second sub-pixel PX2 may each have a center area (or a center point) overlapping the first diagonal line DL1. As an example, as shown in FIG. 17, the first sub-pixel PX1 may have a rectangular shape having a long axis that overlaps the first diagonal line DL1, or have a rectangular shape having a short axis that overlaps the first diagonal line DL1. Further, the second sub-pixel PX2 may have a rectangular shape having a long axis that overlaps the first diagonal line DL1, or have a rectangular shape having a short axis that overlaps the first diagonal line DL1. The third sub-pixel PX3 may have a rectangular shape having a long axis that overlaps the second diagonal line DL2.

When the second side S2 to the eighth side S8 are defined in the clockwise direction with respect to the first side S1 of the virtual octagon VO parallel to one side of the unit area UA, the boundary of the first sub-pixel PX1 may contact the fourth side S4, and the boundary of the second sub-pixel PX2 may contact the eighth side S8. The boundary of the third sub-pixel PX3 parallel to the short axis thereof may contact the second side S2 and the sixth side S6 of the virtual octagon VO. As an example, the first sub-pixel PX1, the second sub-pixel PX2, and the third sub-pixel PX3 may be arranged in X-shape inside the virtual octagon VO.

In another example, the first sub-pixel PX1 may have a circular shape, an elliptical shape, or a polygonal shape that contacts the fourth side S4, and the second sub-pixel PX2 may have a circular shape, an elliptical shape, or a polygonal shape that contacts the eighth side S8. Further, the third sub-pixel PX3 may have an elliptical shape or a polygonal shape having a long axis that overlaps the second diagonal line DL2.

A distance from the center area (or the center point) of the third sub-pixel PX3 to the center area (or the center point) of the first sub-pixel PX1 may be the same as or different from a distance from the center area (or the center point) of the third sub-pixel PX3 to the center area (or the center point) of the second sub-pixel PX2. A shortest distance from the center area (or the center point) of the third sub-pixel PX3 to the boundary of the first sub-pixel PX1 may be the same as or different from a shortest distance from the center area (or the center point) of the third sub-pixel PX3 to the center area (or the center point) of the second sub-pixel PX2.

Referring to FIG. 18, an axis of the first sub-pixel PX1 may be parallel to the first diagonal line DL1 and apart from the first diagonal line DL1. Further, an axis of the second sub-pixel PX2 may be parallel to the first diagonal line DL1 and spaced apart from the first diagonal line DL1. For example, the center area (or the center point) of at least one of the first sub-pixel PX1 and the second sub-pixel PX2 may not be disposed on the first diagonal line DL1. Accordingly, a straight line connecting the center area (or the center point) of the first sub-pixel PX1 to the center area (or the center point) of the second sub-pixel PX2 may intersect the first diagonal line DL1.

Referring to FIGS. 19 and 20, similar to FIG. 17, the third sub-pixel PX3 may have a long axis that overlaps the second diagonal line DL2, but the boundary of the third sub-pixel PX3 may not contact the second side S2 and the sixth side S6.

Similar to FIGS. 12 and 15, the unit area UA may include the first to third vertical lines VL1, VL2, and VL3, and the first to third horizontal lines HL1, HL2, and HL3. For example, the first to third vertical lines VL1, VL2, and VL3 may pass through the virtual octagon VO in the first direction (e.g., the y-axis direction) and may be spaced apart from each other, and the first to third horizontal lines HL1, HL2, and HL3 may pass through the virtual octagon VO in the second direction (e.g., the x-axis direction) and may be spaced apart from each other.

For example, each of the first sub-pixel PX1, the second sub-pixel PX2, and the third sub-pixel PX3 may overlap one of the first to third vertical lines VL1, VL2, and VL3, and may not overlap the rest of the first to third vertical lines VL1, VL2, and VL3. Further, each of the first sub-pixel PX1, the second sub-pixel PX2, and the third sub-pixel PX3 may overlap one of the first to third horizontal lines HL1, HL2, and HL3, and may not overlap the rest of the first to third horizontal lines HL1, HL2, and HL3. As an example, as shown in FIG. 12, the first sub-pixel PX1 may overlap the third vertical line VL3 and the third horizontal line HL3, and may not overlap the rest of the vertical lines and the horizontal lines. The second sub-pixel PX2 may overlap the second vertical line VL2 and the second horizontal line HL2, and may not overlap the rest of the vertical lines and the horizontal lines. The third sub-pixel PX3 may overlap the first vertical line VL1 and the first horizontal line HL1, and may not overlap the rest of the vertical lines and the horizontal lines. For example, one vertical line and one horizontal line may be arranged to pass through only one sub-pixel.

The bank layer 500 may include the first holes 501, the second holes 502, the third holes 503, and the auxiliary holes 510.

The first hole 501 of the bank layer 500 may correspond to (e.g., overlap) the first opening 151 of the pixel-defining layer 150. The second hole 502 of the bank layer 500 may correspond to (e.g., overlap) the second opening 152 of the pixel-defining layer 150. The third hole 503 of the bank layer 500 may correspond to (e.g., overlap) the third opening 153 of the pixel-defining layer 150. For example, when viewed in a direction (e.g., a z-axis direction) perpendicular to an upper surface 400a of the second substrate 400, the first hole 501 of the bank layer 500 may overlap the first opening 151 of the pixel-defining layer 150 that exposes the first pixel electrode 311, the second hole 502 of the bank layer 500 may overlap the second opening 152 of the pixel-defining layer 150 that exposes the second pixel electrode 321, and the third hole 503 of the bank layer 500 may overlap the third opening 153 of the pixel-defining layer 150 that exposes the third pixel electrode 331. Accordingly, when viewed in the direction (e.g., the z-axis direction) perpendicular to the upper surface 400a of the second substrate 400, the shape of the edges of each of the first to third holes 501, 502, and 503 of the bank layer 500 may be the same as or similar to the shape of the edges of the first to third openings 151, 152, and 153 of the pixel-defining layer 150 corresponding thereto. Accordingly, the first hole 501 of the bank layer 500 may correspond to (e.g., overlap) the first pixel electrode 311, the second hole 502 of the bank layer 500 may correspond to (e.g., overlap) the second pixel electrode 321, and the third hole 503 of the bank layer 500 may correspond to (e.g., overlap) the third pixel electrode 331.

Auxiliary holes 530 may be arranged between adjacent sub-pixels. In an embodiment, a first auxiliary hole 530a may be arranged between the second holes 502 adjacent to each other along the first vertical line VL1. A second auxiliary hole 530b may be arranged between the third holes 503 adjacent to each other along the second vertical line VL2. A third auxiliary hole 530c may be arranged between the first holes 501 adjacent to each other along the third vertical line VL3. Fourth auxiliary holes 530d may be arranged along the boundary of the unit area UA in the first direction (e.g., the y-axis direction). As described above, during the process of dotting process of the material for forming the first quantum-dot layer 415 or the material for forming the second quantum-dot layer 425 by using an inkjet printing process, in the case where the materials are not disposed in the intended openings, the auxiliary holes 530 may limit the location of the materials dotted in the erroneous locations.

Figure 21:
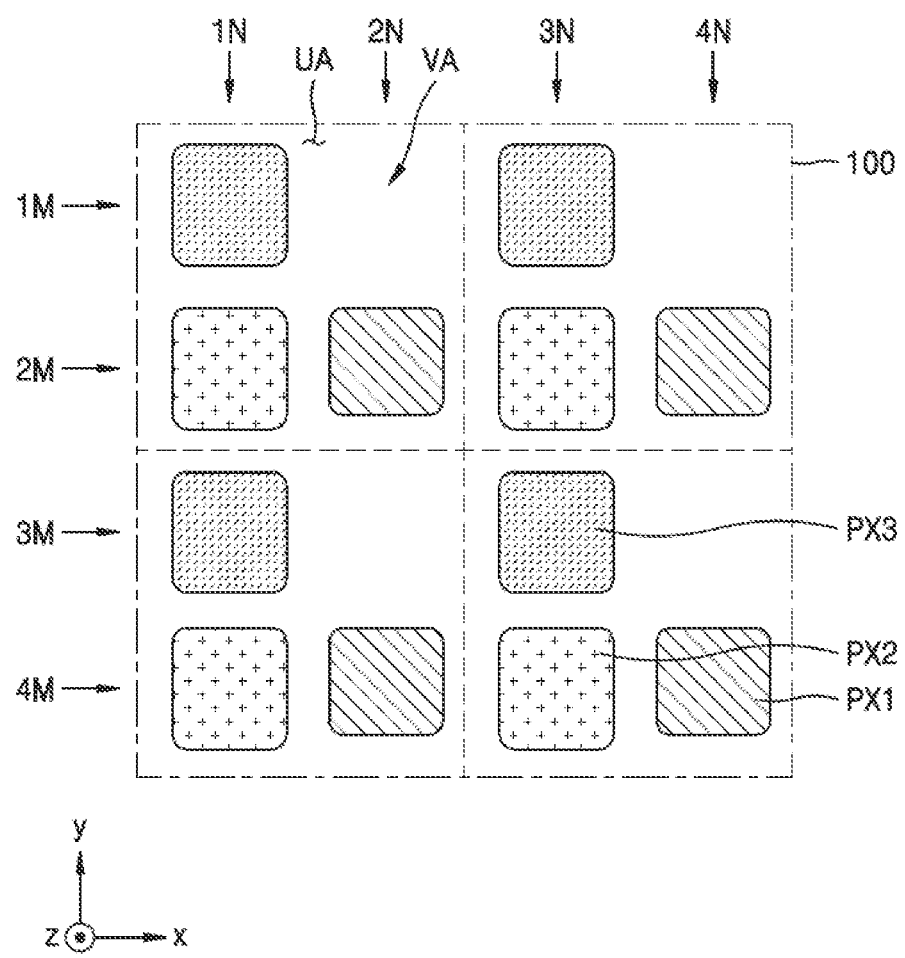
FIG. 21 is a schematic plan view of a portion of the display apparatus of FIG. 1 according to an embodiment.
Figure 22:
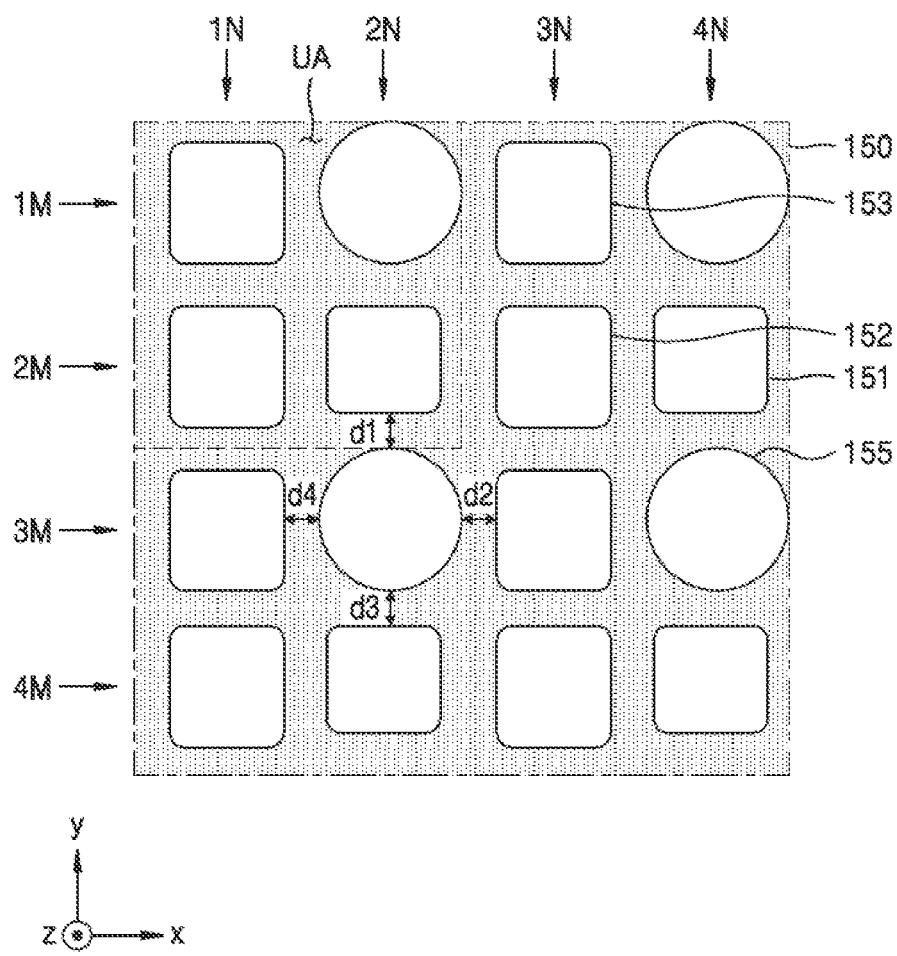
FIG. 22 is a schematic plan view of a pixel-defining layer of the display apparatus of FIG. 21.

FIG. 21 is a schematic plan view of a portion of the display apparatus of FIG. 1 according to an embodiment. FIG. 22 is a schematic plan view of a pixel-defining layer of the display apparatus of FIG. 21.

The unit area UA of FIG. 21 is different from the example of FIG. 3 in that the unit area UA does not include the virtual octagon, and the fourth opening 155 of the pixel-defining layer 150 that overlaps the contact hole 303H of the intermediate layer 303 is disposed inside the unit area UA, not the vertex of the unit area UA. Hereinafter, redundant description of the same element is omitted, and differences are described for descriptive convenience.

Referring to FIG. 21, the first substrate 100 may include unit areas UA, and the first sub-pixel PX1, the second sub-pixel PX2, and the third sub-pixel PX3 may be arranged in each unit area UA. The unit area UA may include a vacant area VA in which the sub-pixels are not arranged.

In an embodiment, the second sub-pixel PX2 and the third sub-pixel PX3 may be alternately arranged in the first direction (e.g., the y-axis direction), and the second sub-pixel PX2 and the first sub-pixel PX1 may be alternately arranged in the second direction (e.g., the x-axis direction).

The vacant area VA may be located between the first sub-pixels PX1 adjacent to each other in the first direction (e.g., the y-axis direction). Further, the vacant area VA may be located between the third sub-pixels PX3 adjacent to each other in the second direction (e.g., the x-axis direction).

The area of the first sub-pixel PX1 may be equal to or greater than the area of the second sub-pixel PX2 and the area of the third sub-pixel PX3. The area of the second sub-pixel PX2 may be equal to or greater than the area of the third sub-pixel PX3. For example, color scheme of the display apparatus may be optimized by adjusting an area ratio of the first sub-pixel PX1, the second sub-pixel PX2, and the third sub-pixel PX3.

Referring to FIG. 22, the pixel-defining layer 150 may include the first openings 151 corresponding to (e.g., overlapping) the first sub-pixels PX1, the second openings 152 corresponding to (e.g., overlapping) the second sub-pixels PX2, the third openings 153 corresponding to (e.g., overlapping) the third sub-pixels PX3, and the fourth openings 155 for contact between the opposite electrode 305 (see FIG. 1) and the auxiliary electrode 134 (see FIG. 1).

The vacant area VA may be a region overlapping the fourth opening 155. The fourth opening 155 may be disposed inside the boundary of the unit area UA. In an embodiment, the fourth opening 155 may contact two boundaries of the unit area UA that intersect each other.

In an embodiment, the third opening 153 and the fourth opening 155 may be alternately arranged on a 1M-th row, the second opening 152 and the first opening 151 may be alternately arranged on a 2M-th row, the third opening 153 and the second opening 152 may be alternately arranged on a 1N-th column, and the fourth opening 155 and the first opening 151 may be alternately arranged on a 2N-th column.

In an embodiment, the boundary of the fourth opening 155 may contact the boundary of the unit area UA. In an embodiment, a distance d1 between the boundary of the fourth opening 155 and the boundary of the first opening 151 adjacent to the fourth opening 155 in the first direction (e.g., the y-axis direction), a distance d2 between the boundary of the fourth opening 155 and the boundary of the third opening 153 adjacent to the fourth opening 155 in the second direction (e.g., the x-axis direction), a distance between the boundary of the fourth opening 155 and the boundary of the first opening 151 adjacent to the fourth opening 155 in an opposite direction of the first direction, and a distance between the boundary of the fourth opening 155 and the boundary of the third opening 153 adjacent to the fourth opening 155 in an opposite direction of the second direction, may be the same. Since the first to fourth openings 151, 152, 153, and 155 are arranged as described above, the brightness of the sub-pixels may be maintained constant and the aperture ratio of each sub-pixel may be improved even in a high-resolution display apparatus.

Figure 23:
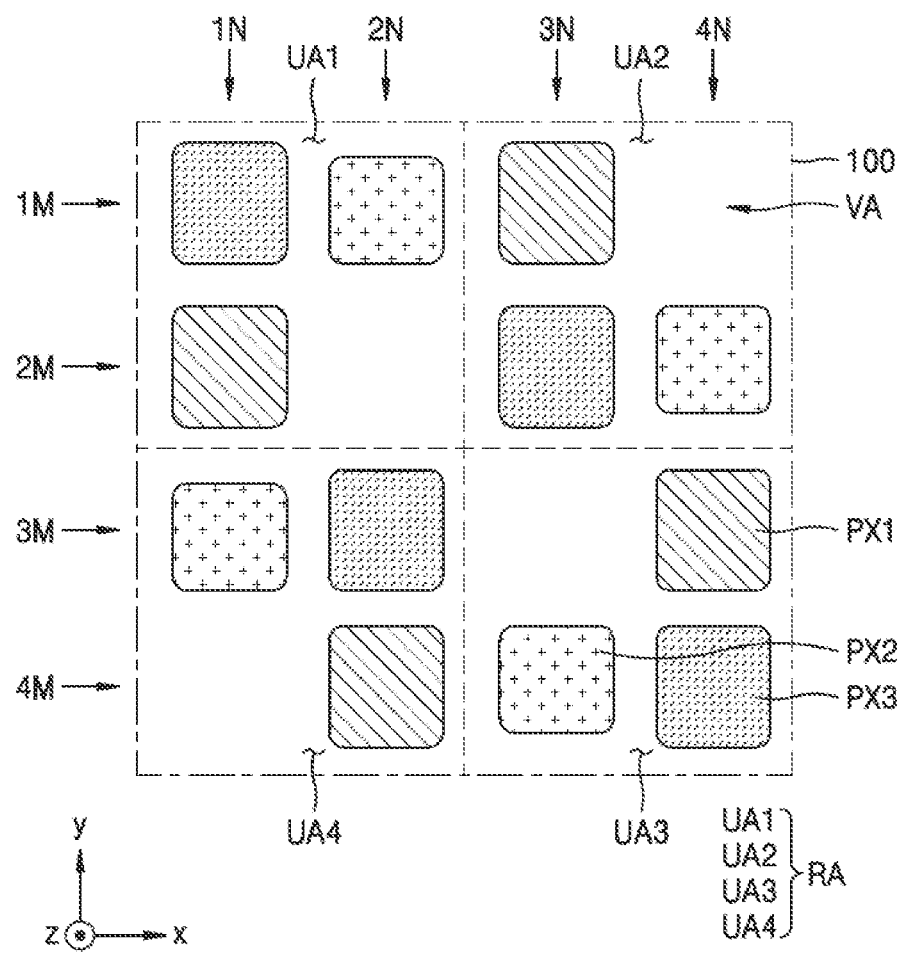
FIGS. 23 and 24 are schematic plan views of a portion of the display apparatus of FIG. 1 according to embodiments.
Figure 24:
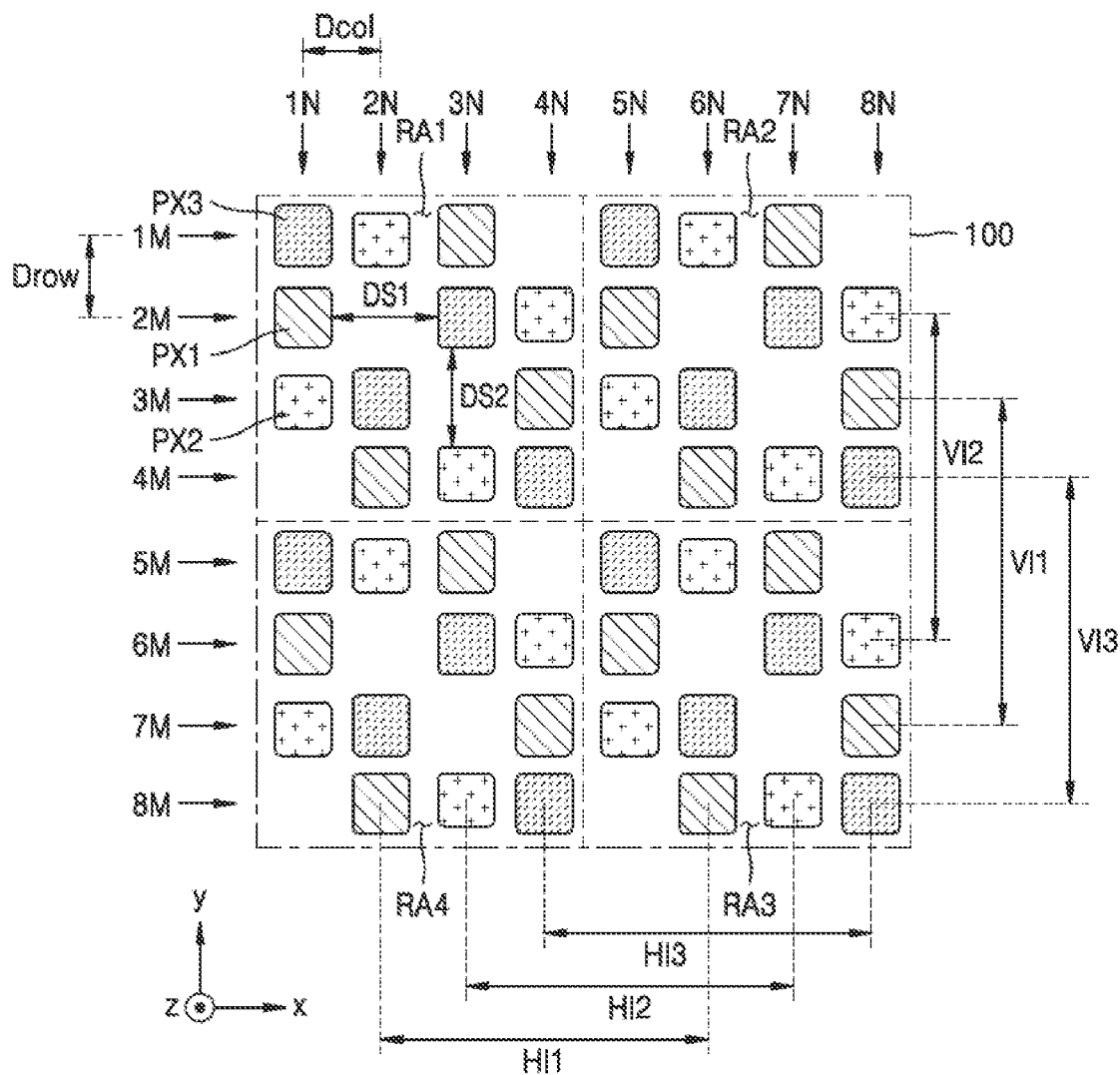

FIGS. 23 and 24 are schematic plan views of a portion of the display apparatus of FIG. 1 according to embodiments.

Referring to FIG. 23, the first substrate 100 may include a first unit area UA1, a second unit area UA2, a third unit area UA3, and a fourth unit area UA4. The first to fourth unit areas UA1, UA2, UA3, and UA4 may constitute a repeated area RA.

The first sub-pixel PX1, the second sub-pixel PX2, and the third sub-pixel PX3 may be arranged in each of the first to fourth unit areas UA1, UA2, UA3, and UA4. Each of the first to fourth unit areas UA1, UA2, UA3, and UA4 may include the vacant area VA in which the sub-pixels are not arranged. As described above, the vacant area VA may be a region corresponding to (e.g., overlapping) the fourth opening 155 of the pixel-defining layer 150 (see FIG. 5A).

In an embodiment, in the repeated area RA, regions corresponding to (e.g., overlapping) the first sub-pixels PX1, the second sub-pixels PX2, and the third sub-pixels PX3, and the vacant areas VA may be arranged in the form of a 4×4-matrix. As an example, the third sub-pixel PX3, the second sub-pixel PX2, the first sub-pixel PX1, and the vacant area VA may be arranged along a 1M-th row, the first sub-pixel PX1, the vacant area VA, the third sub-pixel PX3, and the second sub-pixel PX2 may be arranged along a 2M-th row, the second sub-pixel PX2, the third sub-pixel PX3, the vacant area VA, and the first sub-pixel PX1 may be arranged along a 3M-th row, and the vacant area VA, the first sub-pixel PX1, the second sub-pixel PX2, and the third sub-pixel PX3 may be arranged along a 4M-th row. Each row may include all of the first sub-pixel PX1, the second sub-pixel PX2, and the third sub-pixel PX3. The first sub-pixel PX1 may be spaced apart from the third sub-pixel PX3 by a distance DS1, which is equal to or greater than a column distance Dcol between adjacent columns due to the vacant area VA. For example, the vacant area VA may have an area greater than an area of each of the first sub-pixel PX1, the second sub-pixel PX2, and the third sub-pixel PX3. Further, the third sub-pixel PX3, the first sub-pixel PX1, the second sub-pixel PX2, and the vacant area VA may be arranged along a 1N-th column, the second sub-pixel PX2, the vacant area VA, the third sub-pixel PX3, and the first sub-pixel PX1 may be arranged along a 2N-th column, the first sub-pixel PX1, the third sub-pixel PX3, the vacant area VA, and the second sub-pixel PX2 may be arranged along a 3N-th column, and the vacant area VA, the second sub-pixel PX2, the first sub-pixel PX1, and the third sub-pixel PX3 may be arranged along a 4N-th column. Each column may include all of the first sub-pixel PX1, the second sub-pixel PX2, and the third sub-pixel PX3. The second sub-pixel PX2 may be spaced apart from the third sub-pixel PX3 by a distance DS2, which is equal to or greater than a row distance Drow between adjacent rows due to the vacant area VA. For example, the vacant area VA may have an area greater than an area of each of the first sub-pixel PX1, the second sub-pixel PX2, and the third sub-pixel PX3.

Two sub-pixels each emitting light of a first color, one sub-pixel emitting light of a second color, another sub-pixel emitting light of a third color may be arranged to surround the vacant area VA. For example, since all of the first sub-pixel PX1, the second sub-pixel PX2, and the third sub-pixel PX3 may be arranged in the boundary on any side of the repeated area RA, a phenomenon that mixed color of R/B, R/G, or G/B is viewed in case that the display apparatus is driven in black/white may be reduced.

Referring to FIG. 24, the first substrate 100 may include repeated areas. In an embodiment, a first horizontal distance HI1 between the first sub-pixels PX1 arranged on one of rows may be the same as a first vertical distance VI1 between the first sub-pixels PX1 arranged on one of columns, a second horizontal distance HI2 between the second sub-pixels PX2 arranged on one of rows may be the same as a second vertical distance VI2 between the second sub-pixels PX2 arranged on one of columns, and a third horizontal distance HI3 between the third sub-pixels PX3 arranged on one of rows may be the same as a third vertical distance VI3 between the third sub-pixels PX3 arranged on one of columns.

According to an embodiment, the display apparatus with a reduced defect occurrence possibility during a manufacturing process may be implemented. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate including a unit area having a quadrangular shape; and
a first sub-pixel, a second sub-pixel, and a third sub-pixel disposed in the unit area, the first sub-pixel, the second sub-pixel, and that third sub-pixel that are spaced apart from each other and respectively emit lights of different colors, wherein
the unit area includes a virtual octagon having a center area overlapping a center area of the unit area, the virtual octagon having sides spaced apart from a boundary of the unit area,
the first sub-pixel, the second sub-pixel, and the third sub-pixel are disposed inside the virtual octagon, and
each of boundaries of at least two of the first sub-pixel, the second sub-pixel, and the third sub-pixel overlaps at least one of the sides of the virtual octagon.

2. The display apparatus of claim 1, wherein
the sides of the virtual octagon include a first side, a second side, a third side, a fourth side, a fifth side, a sixth side, a seventh side, and an eighth side that are sequentially disposed in a direction, and
a boundary of the first sub-pixel overlaps the first side, the second side, the third side, the seventh side, and the eighth side of the virtual octagon.

3. The display apparatus of claim 2, wherein
a boundary of the second sub-pixel overlaps the fifth side, the sixth side, and the fifth side of the virtual octagon, and
a boundary of the third sub-pixel overlaps the third side, the fourth side, and the fifth side.

4. The display apparatus of claim 1, wherein
the sides of the virtual octagon include a first side, a second side, a third side, a fourth side, a fifth side, a sixth side, a seventh side, and an eighth side that are sequentially disposed in a direction,
a boundary of the second sub-pixel overlaps the first side, the fifth side, the sixth side, the seventh side, and the eighth side of the virtual octagon,
a boundary of the third sub-pixel overlaps the first side, the second side, the third side, the fourth side, and the fifth side of the virtual octagon, and
the first sub-pixel is disposed between the second sub-pixel and the third sub-pixel.

5. The display apparatus of claim 4, wherein a boundary of the first sub-pixel overlaps the first side and the fifth side of the virtual octagon.

6. The display apparatus of claim 1, wherein
the sides of the virtual octagon include a first side, a second side, a third side, a fourth side, a fifth side, a sixth side, a seventh side, and an eighth side that are sequentially disposed in a direction,
the unit area includes a first sub-unit area, a second sub-unit area, a third sub-unit area, and a fourth sub-unit area,
the first sub-pixel includes a first-first sub-pixel in the first sub-unit area, a first-second sub-pixel in the second sub-unit area, a first-third sub-pixel in the third sub-unit area, and a first-fourth sub-pixel in the fourth sub-unit area,
the second sub-pixel includes a second-first sub-pixel in the first sub-unit area, a second-second sub-pixel in the second sub-unit area, a second-third sub-pixel in the third sub-unit area, and a second-fourth sub-pixel in the fourth sub-unit area,
the third sub-pixel includes a third-first sub-pixel in the first sub-unit area, a third-second sub-pixel in the second sub-unit area, a third-third sub-pixel in the third sub-unit area, and a third-fourth sub-pixel in the fourth sub-unit area, and
the first-first sub-pixel in the first sub-unit area has a boundary that contacts the seventh side of the virtual octagon,
the second-first sub-pixel in the first sub-unit area is disposed to be adjacent to the center area of the virtual octagon,
the third-first sub-pixel in the first sub-unit area has a boundary that contacts the first side of the virtual octagon,
the first-second sub-pixel, the second-second sub-pixel, and the third-second sub-pixel disposed in the second sub-unit area are symmetrical to the first-first sub-pixel, the second-first sub-pixel, and the third-first sub-pixel in the first sub-unit area with respect to a first central line extending in a first direction and passing through the center area of the virtual octagon,
the first-third sub-pixel, the second-third sub-pixel, and the third-third sub-pixel disposed in the third sub-unit area are point-symmetrical to the first-first sub-pixel, the second-first sub-pixel, and the third-first sub-pixel in the first sub-unit area with respect to the center area of the virtual octagon, and
the first-fourth sub-pixel, the second-fourth sub-pixel, and the third-fourth sub-pixel disposed in the fourth sub-unit area are symmetrical to the first-first sub-pixel, the second-first sub-pixel, and the third-first sub-pixel in the first sub-unit area with respect to a second central line extending in a second direction perpendicular to the first direction, and passing through the center area of the virtual octagon.

7. The display apparatus of claim 1, wherein
the sides of the virtual octagon include a first side, a second side, a third side, a fourth side, a fifth side, a sixth side, a seventh side, and an eighth side that are sequentially disposed in a direction,
the first sub-pixel includes a plurality of first sub-pixels,
the second sub-pixel includes a plurality of second sub-pixels,
the third sub-pixel includes a plurality of third sub-pixels, and
the first side, the third side, the fifth side, and the seventh side of the virtual octagon overlap a boundary of at least one of the plurality of first sub-pixels, a boundary of at least one of the plurality of second sub-pixels, and a boundary of at least one of the plurality of third sub-pixels.

8. The display apparatus of claim 7, wherein the plurality of first sub-pixels are apart from each other in a diagonal direction of the unit area.

9. The display apparatus of claim 1, wherein
the unit area has a first virtual vertical line, a second virtual vertical line, a third virtual vertical line, a first virtual horizontal line, a second virtual horizontal line, and a third virtual horizontal line,
the first virtual vertical line, the second virtual vertical line, and the third virtual vertical line pass through the virtual octagon in a first direction and are spaced apart from each other, and
the first virtual horizontal line, the second virtual horizontal line, and the third virtual horizontal line pass through the virtual octagon in a second direction and are spaced apart from each other, the first virtual vertical line and the first virtual horizontal line pass only the first sub-pixel, the second virtual vertical line and the second virtual horizontal line pass only the second sub-pixel, and the third virtual vertical line and the third virtual horizontal line pass only the third sub-pixel.

10. The display apparatus of claim 9, further comprising:
a bank layer disposed in the unit area, the bank layer including:
   a first hole overlapping the first sub-pixel,
   a second hole overlapping the second sub-pixel,
   a third hole overlapping the third sub-pixel, and
   auxiliary holes;
a first quantum-dot layer disposed in the first hole; and
a second quantum-dot layer disposed in the second hole, wherein
some of the auxiliary holes are disposed along the first, second, and third virtual vertical lines or the first, second, and third virtual horizontal lines.

11. The display apparatus of claim 10, wherein the some of the auxiliary holes are disposed in a region between adjacent two sub-pixels among the first, second, and third sub-pixels.

12. The display apparatus of claim 10, wherein the some of the auxiliary holes are disposed along a boundary of the unit area.

13. The display apparatus of claim 1, wherein
the sides of the virtual octagon include a first side, a second side, a third side, a fourth side, a fifth side, a sixth side, a seventh side, and an eighth side that are sequentially disposed in a direction, the third sub-pixel has a rectangular shape having a long axis that overlaps a first diagonal line connecting vertexes of the unit area, a center area of the first sub-pixel overlaps a second diagonal line connecting vertexes of the unit area, and a center area of the second sub-pixel overlaps the second diagonal line.

14. The display apparatus of claim 13, wherein a boundary of the third sub-pixel overlaps the second side and the sixth side of the virtual octagon.

15. The display apparatus of claim 14, wherein a boundary of the first sub-pixel overlaps the fourth side of the virtual octagon.

16. The display apparatus of claim 15, wherein a boundary of the second sub-pixel overlaps the eighth side of the virtual octagon.

17. The display apparatus of claim 1, further comprising:
a pixel-defining layer disposed over the substrate, the pixel-defining layer including:
   a first opening that exposes a central portion of a pixel electrode of the first sub-pixel,
   a second opening that exposes a central portion of a pixel electrode of the second sub-pixel,
   a third opening that exposes a central portion of a pixel electrode of the third sub-pixel, and
   fourth openings each having a center area at each vertex of the unit area, wherein
a boundary of the first sub-pixel overlaps the first opening,
a boundary of the second sub-pixel overlaps the second opening, and
a boundary of the third sub-pixel overlaps the third opening.

18. The display apparatus of claim 17, further comprising:
a plurality of auxiliary electrodes disposed over the substrate;
an intermediate layer including:
   an emission layer disposed on a pixel electrode of the first sub-pixel, a pixel electrode of the second sub-pixel, and a pixel electrode of the third sub-pixel, and
   contact holes that respectively overlap the fourth openings; and
an opposite electrode disposed on the intermediate layer, wherein
the fourth openings and the contact holes expose a portion of each of the auxiliary electrodes, and
the opposite electrode is electrically connected to the auxiliary electrodes through the fourth openings and the contact holes.

19. The display apparatus of claim 17, further comprising:
a plurality of auxiliary wirings disposed over the substrate;
an intermediate layer including:
   an emission layer disposed on a pixel electrode of the first sub-pixel, a pixel electrode of the second sub-pixel, and a pixel electrode of the third sub-pixel, and
   contact holes that respectively overlap the fourth openings; and
an opposite electrode disposed on the intermediate layer, wherein
the fourth openings and the contact holes expose a portion of each of the auxiliary wirings, and
the opposite electrode is electrically connected to the auxiliary wirings through the fourth openings and the contact holes.

20. The display apparatus of claim 1, wherein
an area of the first sub-pixel is greater than an area of the second sub-pixel and an area of the third sub-pixel, and
the area of the second sub-pixel is equal to or greater than the area of the third sub-pixel.

* * * * *